US011362263B2

(12) United States Patent
Sato et al.

(10) Patent No.: US 11,362,263 B2
(45) Date of Patent: Jun. 14, 2022

(54) SPIN ORBIT TORQUE (SOT) MEMORY DEVICES AND METHODS OF FABRICATION

(71) Applicant: Intel Corporation, Santa Clara, CA (US)

(72) Inventors: Noriyuki Sato, Hillsboro, OR (US); Tanay Gosavi, Hillsboro, OR (US); Justin Brockman, Portland, OR (US); Sasikanth Manipatruni, Portland, OR (US); Kaan Oguz, Portland, OR (US); Kevin O'Brien, Portland, OR (US); Christopher Wiegand, Portland, OR (US); Angeline Smith, Hillsboro, OR (US); Tofizur Rahman, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 750 days.

(21) Appl. No.: 16/024,411

(22) Filed: Jun. 29, 2018

(65) Prior Publication Data

US 2020/0006631 A1 Jan. 2, 2020

(51) Int. Cl.
*H01L 43/02* (2006.01)
*G11C 11/16* (2006.01)
*H01L 43/12* (2006.01)
*H01L 43/10* (2006.01)
*B82Y 25/00* (2011.01)

(52) U.S. Cl.
CPC ............ *H01L 43/02* (2013.01); *G11C 11/161* (2013.01); *H01L 43/10* (2013.01); *H01L 43/12* (2013.01); *B82Y 25/00* (2013.01)

(58) Field of Classification Search
CPC ......... H01L 43/02; H01L 43/10; H01L 43/12; G11C 11/161; B82Y 25/00
USPC ......................................................... 257/421
See application file for complete search history.

(56) References Cited

U.S. PATENT DOCUMENTS

| | | | |
|---|---|---|---|
| 9,251,883 B2* | 2/2016 | Wu ..................... | G11C 11/1693 |
| 10,276,784 B1* | 4/2019 | Yu .......................... | H01L 43/12 |
| 2009/0166773 A1* | 7/2009 | Ohno .................... | G11C 11/161 |
| | | | 257/421 |
| 2014/0056060 A1* | 2/2014 | Khvalkovskiy ........ | H01L 43/02 |
| | | | 365/158 |
| 2016/0079518 A1* | 3/2016 | Pi ........................ | G11C 11/1675 |
| | | | 257/421 |
| 2016/0225423 A1* | 8/2016 | Naik ..................... | H01L 27/228 |
| 2018/0158588 A1* | 6/2018 | Manipatruni ........... | H01L 43/08 |
| 2018/0374526 A1* | 12/2018 | Lee ........................ | H01L 43/02 |
| 2019/0131518 A1* | 5/2019 | Yu ........................ | G11C 11/161 |
| 2019/0244651 A1* | 8/2019 | Shiokawa ............. | G11C 11/161 |
| 2019/0287589 A1* | 9/2019 | Buyandalai ........... | H01L 27/228 |
| 2019/0304524 A1* | 10/2019 | Oguz .................... | H01L 43/02 |
| 2019/0304653 A1* | 10/2019 | Oguz ................... | H01F 10/3254 |
| 2019/0305216 A1* | 10/2019 | Gosavi .................... | H01L 43/02 |

(Continued)

*Primary Examiner* — Jami Valentine Miller
(74) *Attorney, Agent, or Firm* — Essential Patents Group, LLP

(57) ABSTRACT

A perpendicular spin orbit torque (SOT) memory device includes an electrode having a spin orbit coupling material and a magnetic tunnel junction (MTJ) device on a portion of the electrode. The electrode has a first SOC layer and a second SOC layer on a portion of the first SOC layer, where at least a portion of the first SOC layer at an interface with the second SOC layer includes oxygen.

20 Claims, 14 Drawing Sheets

(56) References Cited

U.S. PATENT DOCUMENTS

| | | |
|---|---|---|
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0303343 A1 | 9/2020 | Manipatruni et al. |
| 2020/0303344 A1 | 9/2020 | Manipatruni et al. |
| 2020/0321344 A1 | 10/2020 | Ramamoorthy et al. |
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |
| 2021/0303981 A1 * | 9/2021 | Sasaki ............... H01L 43/10 |

\* cited by examiner

SPIN ORBIT TORQUE (SOT) MEMORY DEVICES AND METHODS OF FABRICATION

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely on innovative devices such as spin orbit torque (SOT) memory devices including a spin orbit torque electrode coupled with a compatible MTJ device to overcome the requirements imposed by scaling.

Non-volatile embedded memory with SOT memory devices, e.g., on-chip embedded memory with non-volatility can enable energy and computational efficiency. However, the technical challenges of assembling a material layer stack to form functional SOT memory devices present formidable roadblocks to commercialization of this technology today. Specifically, increasing thermal stability in SOT memory devices is an important area of process development.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
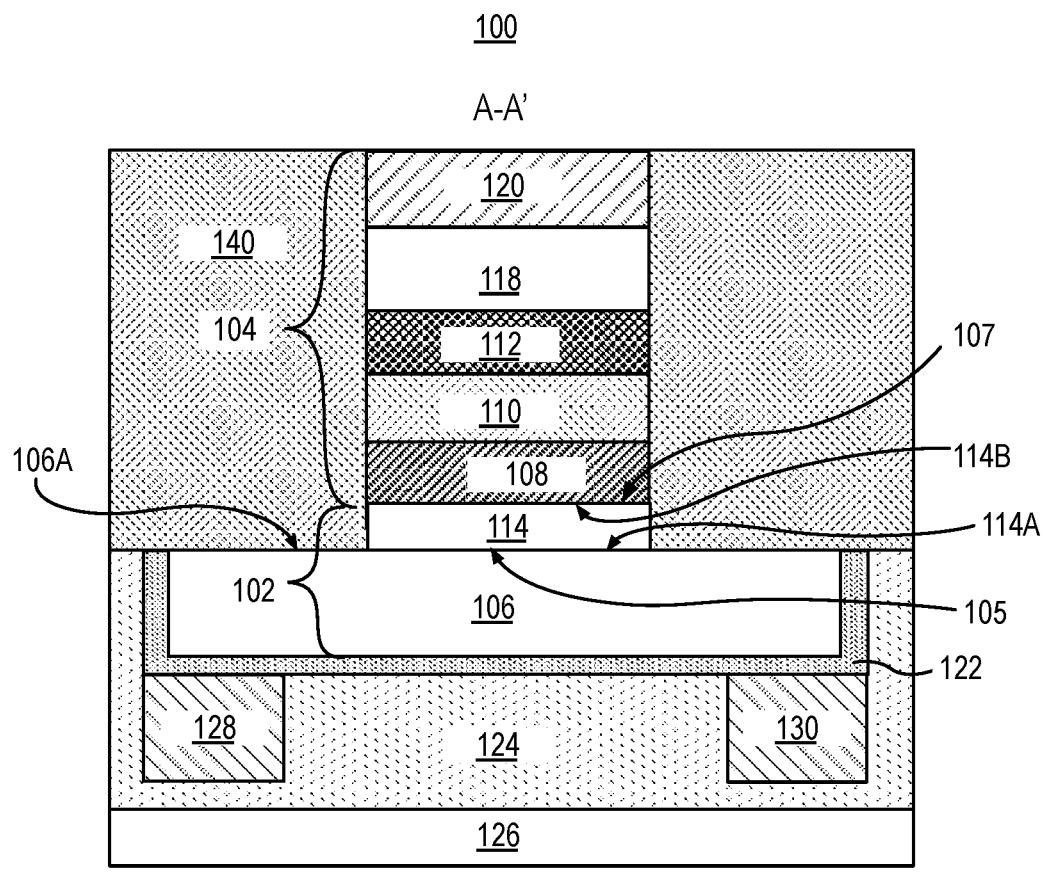
FIG. 1A illustrates a cross-sectional view of a spin orbit torque (SOT) memory device, in accordance with an embodiment of the present disclosure.

Spin orbit torque (SOT) memory devices with reduced switching current and their methods of fabrication are described. In the following description, numerous specific details are set forth, such as novel structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

A SOT memory device may include a magnetic tunnel junction (MTJ) device coupled with a spin orbit torque electrode. The MTJ device functions as a memory device where the resistance of the MTJ device switches between a high resistance state and a low resistance state. The resistance state of an MTJ device is defined by the relative orientation of magnetization between a free magnet and a fixed magnet, that is separated from the free magnet by a tunnel barrier. When the magnetization of the free magnet and a fixed magnet have orientations that are in the same direction, the MTJ device is said to be in a low resistance state. Conversely, when the magnetization of the free magnet and a fixed magnet each have orientations that are in opposite direction to each other, the MTJ device is said to be in a high resistance state.

In an embodiment, in an absence of a spin orbit torque electrode, resistance switching in an MTJ device is brought about by passing a critical amount of spin polarized current through the MTJ device so as to influence the orientation of the magnetization of the free magnet to align with the magnetization of the fixed magnet. The act of influencing the magnetization is brought about by a phenomenon known as spin torque transfer, where the torque from the spin polarized current is imparted to the magnetization of the free magnet. By changing the direction of the spin polarized current, the direction of magnetization in the free magnet may be reversed relative to the direction of magnetization in the fixed magnet. Since the free magnet does not need a constant source of spin polarized current to maintain a magnetization direction, the resistance state of the MTJ device is retained even when no current flows through the MTJ device. For this reason, the MTJ device belongs to a class of memory known as non-volatile memory.

As an MTJ device is scaled down in size, the amount of critical spin polarized current density required to switch the device increases. By implementing an MTJ device on a SOT electrode, the magnetization in the free magnet may undergo torque assisted switching from a Spin Hall current, induced by passing an electrical current in a transverse direction, through the SOT electrode. The Spin Hall current arises from spin dependent scattering of electrons due to a phenomenon known as spin orbit interaction. Electrons of one spin polarity are directed towards an upper portion of the spin orbit torque electrode and electrons with an opposite spin polarity are directed toward a bottom portion of the spin orbit torque electrode. Electrons of a particular spin polarity are directed toward the MTJ device and impart a spin orbit torque on the magnetization of the free magnet. The spin hall current may also help the MTJ device switch faster. It is to be appreciated that, in an embodiment, the spin hall current can fully switch a free magnet having a magnetization that is oriented in an in-plane direction, even in the absence of a spin polarized current passing through the MTJ device. An in-plane direction is defined as a direction that is parallel to an uppermost surface of the spin orbit torque electrode. An external field may be utilized to help break the symmetry required to exert a torque to completely switch the free magnet.

Integrating a non-volatile memory device such as an SOT memory device onto access transistors enables the formation of embedded memory for system on chip applications. However, approaches to integrate an SOT memory device onto access transistors presents challenges that have become far more formidable with scaling. One such challenge arises from integrating an MTJ device with an SOT electrode including a single layer of spin orbit coupling (SOC) material. Patterning an MTJ device on a sufficiently thin SOC layer can result in loss of the SOC material that is not covered by an MTJ device. A loss of the SOC material may result in a lower amount of spin diffusion current available to switch a MTJ memory device or in some instances complete loss of spin diffusion current when the SOC material is completely etched. However, implementing an SOT electrode having dual layers of spin orbit coupling (SOC) material can minimize loss due to etch. The dual layers may include a first layer that is patterned before the formation of the MTJ device, and a second layer (above the first layer) that is patterned immediately after formation of the MTJ device. Typically, the second layer is thinner than the first layer and may absorb impact from an energetic MTJ over etch process. An additional advantage of an SOT electrode having dual layers of SOC material is the elimination of an air break during the deposition between a SOC layer and a lowermost layer of an MTJ material layer stack (typically the free layer). Eliminating an air break can lower an effective electrical resistance, and potentially the switching current. A dual layer SOT electrode can also minimize impact of misalignment during lithographic patterning of the MTJ device. Since the second SOC layer is patterned immediately after formation of MTJ device and has a footprint of the MTJ device, misalignment between the MTJ device and the pre-patterned first layer can be minimized.

In accordance with embodiments of the present disclosure, a spin orbit torque (SOT) memory device includes a magnetic tunnel junction (MTJ) device. The MTJ device includes a fixed magnet, a first electrode coupled with the fixed magnet, a free magnet and a tunnel barrier between the free magnet and the fixed magnet. The free magnet of MTJ device is coupled to an electrode including a spin orbit torque material (herein after referred to as the SOT electrode). In an embodiment, the SOT electrode is a dual layer SOT electrode that includes a first layer including a spin orbit coupling material, that has a first lateral length. The dual layer SOT electrode further includes a second layer including the spin orbit coupling material of the first SOC layer. With such a dual layer electrode, at least a portion of the first SOC layer proximal to the second SOC layer may include oxygen, for example introduced in during its processing at other an ultrahigh vacuum prior to the formation of the second SOC layer. The oxygen may or may not be distributed uniformly. There may be interfacial regions between the first SOC layer and the second SOC layer, where there is no oxygen. The second SOC layer is between the free magnet and the first layer and has an uppermost surface and a lowermost surface. The uppermost surface has an area that is the same or substantially the same as an area of a lowermost surface of the free magnet. Furthermore, the perimeter of the uppermost surface is substantially aligned with a perimeter of the lowermost surface of the free magnet. The lowermost surface of the second SOC layer is in contact with the first SOC layer over a second lateral length that is smaller than the first lateral length. The MTJ device may be located within a perimeter of the first SOC layer. In some instances, the MTJ device may have portions that are not entirely confined within the perimeter of the first SOC layer. In some such instances, the second SOC layer has portions that are also not entirely confined within the perimeter of the first layer.

The SOT memory device undergoes magnetization switching when a spin diffusion current is generated in the first layer and is subsequently transmitted through the second layer into the free magnet. As discussed above, when the MTJ device has portions that are outside of the perimeter of the first layer, spin diffusion current may still be transmitted into the entire lowermost surface of the free magnet of the MTJ device through the spin orbit coupling material of the second layer.

FIG. 1A is an illustration of a cross-sectional view of a SOT memory device 100 in accordance with an embodiment of the present disclosure. The spin orbit torque (SOT) memory device 100 includes a magnetic tunnel junction (MTJ) device 104. The MTJ device 104 includes a fixed magnet 112, a first electrode 120 coupled with the fixed magnet 112, a free magnet 108 and a tunnel barrier 110 between the free magnet 108 and the fixed magnet 112. The free magnet 108 of MTJ device 104 is coupled to an electrode 102 including a spin orbit torque material (herein after referred to as the SOT electrode). The SOT electrode 102 is a dual layer SOT electrode 102 that includes a first SOC layer 106 including a spin orbit coupling (SOC) material, that has a first lateral length. The SOT electrode 102 further includes a second SOC layer 114 including the SOC material. The second SOC layer 114 is between the free magnet 108 and the first SOC layer 106 as illustrated. The lowermost surface 114A of the second SOC layer 114 is in contact with the first SOC layer 106 over a second lateral length that is smaller than the first lateral length. At least a portion of the first SOC layer 106 at an interface 105 with the second SOC layer 114 includes oxygen. In some examples, the oxygen may be distributed uniformly. In some such examples, the portion of the first layer including oxygen has a thickness between 0.1 nm and 0.3 nm. In other examples, the oxygen is not distributed uniformly. In some examples, a second portion of the first SOC layer 106 at an interface 105 with the second layer 116 has no oxygen. The second portion may be an annular region or a plurality of regions in the first SOC layer 106 at an interface 105.

In some embodiments, at least a portion of the second SOC layer 114 at an interface 107 proximal to the free magnet 108 includes oxygen. In some such embodiments, the oxygen may be concentrated at the peripheral portions of the second SOC layer 114 at the interface 107. In an embodiment, the portion of the first SOC layer 106 at an interface 105 with the second SOC layer 114 has a greater concentration of oxygen compared to oxygen in a portion of the second SOC layer 114 at an interface 107 proximal to the free magnet 108.

The characteristics of the uppermost surface 106A of first SOC layer 106 at interface 105 may also differ from an uppermost surface 114B of the second SOC layer 114. For example, the uppermost surface 106A of the first SOC layer 106 may have a surface roughness that is less than a surface roughness of an uppermost surface 114B of the second SOC layer 114. In some embodiments, the uppermost surface 106A has a surface roughness that is less than 0.5 nm.

Figure 1B:
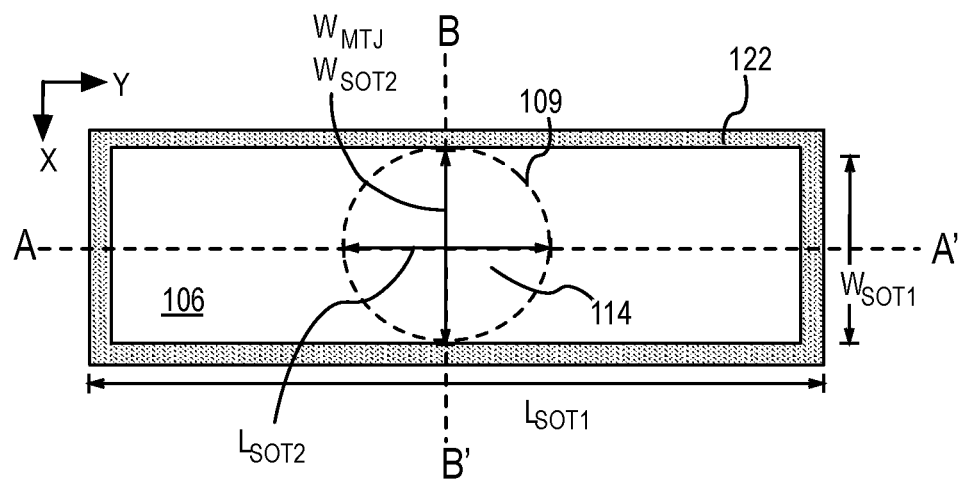
FIG. 1B illustrates a plan view of a magnetic tunnel junction (MTJ) device on a spin orbit torque electrode, in accordance with an embodiment of the present disclosure.

FIG. 1B illustrates a plan view of the MTJ device 104 on a SOT electrode 102, in accordance with an embodiment of the present disclosure. The MTJ device 104 may be located within a perimeter of the first SOC layer 106 as depicted. In an embodiment, the first SOC layer 106 has a rectangular plan view profile, having a width given by $W_{SOT1}$ and a length given by $L_{SOT1}$. In an embodiment, the first SOC layer has a length, $L_{SOT1}$, between 100 nm-500 nm. In an embodiment, the first SOC layer 106 has a width, $W_{SOT1}$, between 10 nm-50 nm.

The first SOC layer 106 includes a metal with high degree of spin orbit coupling. A metal with a high degree of spin-orbit coupling has an ability to inject a large spin polarized current in to the free magnet 108. A large spin polarized current can exert a large amount of torque and influence the magnetization of the free magnet 108 to switch faster. In an embodiment, the first SOC layer 106 includes a metal such as but not limited to tantalum, tungsten, platinum or gadolinium (β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. Layers of 2D materials of $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. In an embodiment, first SOC layer 106 includes a beta phase tantalum or beta phase tungsten. A first SOC layer 106 including a beta phase tantalum or beta phase tungsten has a high spin hall efficiency. A high spin hall efficiency denotes that the SOT electrode 102 can generate a large spin hall current for a given charge current that is passed through the SOT electrode 102. In an embodiment, the first SOC layer 106 has thickness between 4 nm and 10 nm.

In an embodiment, the second SOC layer 114 includes the material of the first SOC layer 106. Depending on choice of materials the second SOC layer 114 has a thickness between 1 nm and 4 nm.

In the illustrative embodiment, a perimeter of the MTJ device 104 is indicated by the dashed line 109. A perimeter of the second SOC layer 114 is the same or substantially the same as the perimeter of the MTJ device 104. The second SOC layer 114 (inside the dashed line 109) has a width given by $W_{SOT2}$ and a length given by $L_{SOT2}$. In an embodiment, the width $W_{SOT2}$ is the same or substantially the same as $W_{SOT1}$ of the first SOC layer 106. In some examples, such as is illustrated, the MTJ device 104 has a plan view shape that is circular. In some such examples, the free magnet 108 of the MTJ device 104 has a diameter that is equal to the width $W_{SOT2}$ and $_{also}$ equal to the width $W_{SOT1}$. When the MTJ device 104 has a plan view shape that is circular, the second SOC layer 114 has a length $L_{SOT2}$ and width $W_{SOT2}$ that is equal to or substantially equal to the diameter of the MTJ. In some examples, a MTJ device 104 having a circular plan view shape has a diameter that is between 10 nm-50 nm.

In another embodiment, when an MTJ memory device is an in-plane MTJ device, the in-plane MTJ device has a plan view profile that is elliptical. In some such examples the in-plane MTJ device has a broadest cross-sectional width that is substantially equal to $W_{SOT1}$.

In some embodiments, such as illustrated in FIG. 1A, the SOT device 100 further includes a conductive layer 122 adjacent to a sidewall of the first SOC layer 106, between the sidewall of the first SOC layer 106 and a dielectric layer 124. The conductive layer 122 is also between the lowermost surface of the first SOC layer 106 and the dielectric layer 124. The conductive layer 122, for instance, may include a material such as tantalum, ruthenium, tantalum nitride or titanium nitride. The conductive layer 122 has a thickness that is between 2 nm and 10 nm.

Figure 1C:
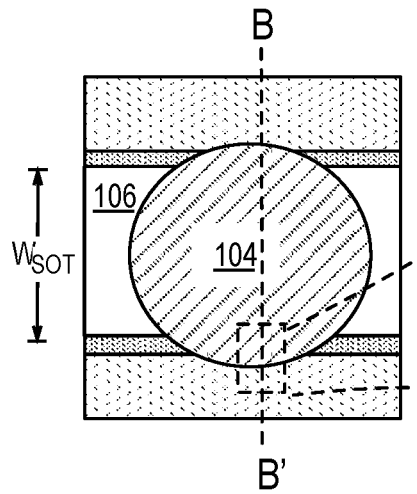
FIG. 1C illustrates a plan view of a magnetic tunnel junction (MTJ) device on a spin orbit torque electrode, where the MTJ device has a larger width than a width of a first SOC layer, in accordance with an embodiment of the present disclosure.

In some instances, the MTJ device 104 may have a width $W_{MTJ}$ that is larger than the width $W_{SOT1}$ as shown in the plan view illustration of FIG. 1C. In such instances the MTJ device 104 has portions that are not entirely confined within the perimeter of the first SOC layer 106. In some such instances, since the second SOC layer 114 is at least as wide as the MTJ device 104, portions of the second SOC layer 114 extend over an uppermost surface of the conductive layer 122 as shown in the enhanced cross-sectional illustration of FIG. 1D. In some embodiments, uppermost portion 122A of the conductive layer 122 proximal to the second SOC layer 114 includes oxygen. The amount of oxygen in the uppermost portion 122A may be different from the amount of oxygen in the uppermost portion 106B of the first SOC layer 106. In some embodiments, portion 122A has a thickness between 0.1 nm and 0.3 nm. Depending on the material of the conductive layer 122, the amount of oxygen in uppermost portion 122A proximal to the second SOC layer 114 may be substantially zero.

Figure 1D:
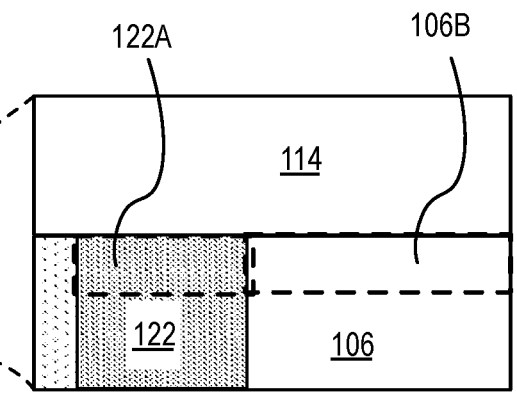
FIG. 1D illustrates an enhanced cross-section through a portion of the spin orbit torque electrode depicted in FIG. 1C, where an interface between a second spin orbit torque layer and a conductive layer includes oxygen, in accordance with an embodiment of the present disclosure.
Figure 1E:
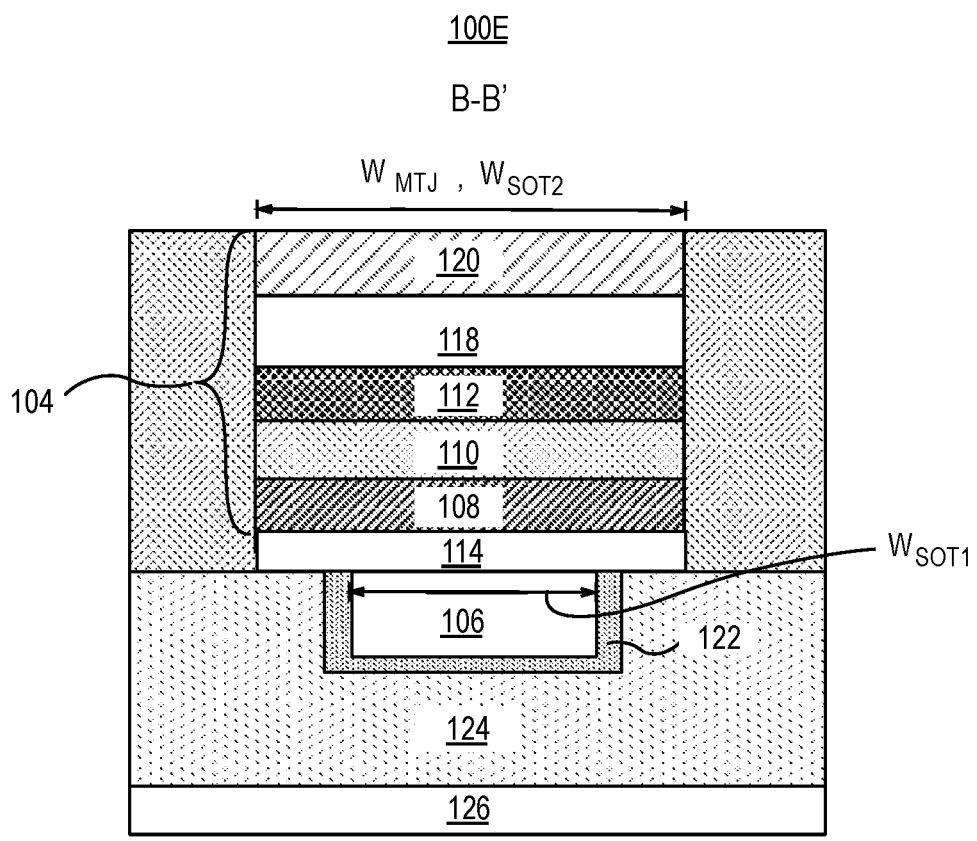
FIG. 1E illustrates a cross-section through the spin orbit torque electrode depicted in FIG. 1C, in accordance with an embodiment of the present disclosure.

FIG. 1E illustrates a cross sectional view of a SOT device 100E. The SOT device 100E is a cross section of an SOT device represented in FIG. 1C, along a direction B-B'. In the illustrative embodiment, the width $W_{SOT2}$ is greater than $W_{SOT1}$ and the second SOC layer 114 extends over the conductive layer 122 and onto a portion of a surrounding dielectric layer 124. In some instances, the dielectric layer 124 is a material including oxygen. Depending on the material of the second SOC layer 114, lower most portions of the second SOC layer 114 that are in contact with the dielectric layer 124 may include oxygen.

Figure 1F:
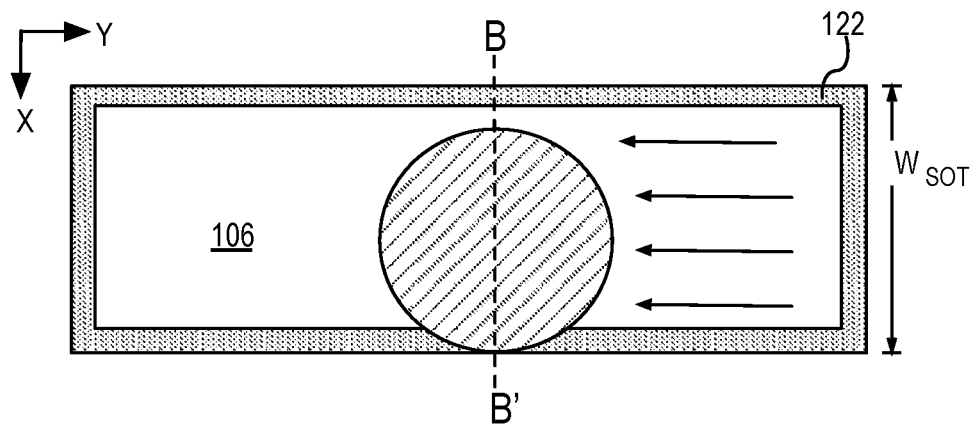
FIG. 1F illustrates a plan view of a magnetic tunnel junction (MTJ) device on a spin orbit torque electrode, where the MTJ device is misaligned from an axial center of the first SOC layer, in accordance with an embodiment of the present disclosure.

In some embodiments the MTJ device 104 may be misaligned relative to an axial center of the first SOC layer 106. In other instances, the MTJ device 104 has a width that is substantially the same as the width of the first SOC layer 106 but, the MTJ device 104 is misaligned from the first SOC layer 106 as illustrated in FIG. 1F. In some such instances, in spite of the misalignment, the spin diffusion current flows (indicated by arrow 168) into the second SOC layer 114 from the first SOC layer 106 illustrated in FIG. 1G.

The free magnet 108 of the MTJ device 104 experiences torque from the spin diffusion current 168 along an entire length, $L_{SOT2}$ (and $W_{SOT2}$) of the second SOC layer 114.

While MTJ device 104 is shown to be located substantially at a center of the first SOC layer 106 (along the length, Y-direction) in FIGS. 1B and 1D, other locations along the length of the first SOC layer 106 are also possible. An electrical resistance of the first SOC layer 106 may play a role in positioning the MTJ device 104 along the length of the first SOC layer 106. An MTJ device located at a middle of the first SOC layer 106 may be advantageous for minimizing asymmetry in spin diffusion current.

Referring once again to FIG. 1A, in an embodiment, the free magnet 108 includes a magnetic material such as Co, Ni, Fe or alloys of these materials. In an embodiment, the free magnet 108 includes a magnetic material such as CoB, FeB, CoFe and CoFeB. In some embodiments, the free magnet 108 includes a $Co_{100-x-y}Fe_xB_y$, where X and Y each represent atomic percent, further where X is between 50-80 and Y is between 10-40, and further where the sum of X and Y is less than 100. In one specific embodiment, X is 60 and Y is 20. In an embodiment, the free magnet 108 is FeB, where the concentration of boron is between 10-40 atomic percent of the total composition of the FeB alloy. In an embodiment, the free magnet 108 has a thickness between 0.9 nm-2.0 nm for MTJ devices.

In an embodiment, tunnel barrier 110 includes a material suitable for allowing electron current having a majority spin to pass through tunnel barrier 110, while impeding, at least to some extent, electron current having a minority spin from passing through tunnel barrier 110. Thus, tunnel barrier 110 (or spin filter layer) may also be referred to as a tunneling layer for electron current of a particular spin orientation. In an embodiment, the tunnel barrier 110 includes a material such as, but not limited to, oxygen and at least one of magnesium (e.g., a magnesium oxide, or MgO), or aluminum (e.g., an aluminum oxide such as $Al_2O_3$). In the illustrative embodiment, the tunnel barrier 110 including MgO has a crystal orientation that is (001) and is lattice matched to fixed magnet 112 below the tunnel barrier 110 and free magnet 108 above the tunnel barrier 110. In an embodiment, a free magnet 108 including a $Co_{100-x-y}Fe_xB_y$, is highly lattice matched to the tunnel barrier 110 including an MgO. Lattice matching a crystal structure of the free magnet 108 with the tunnel barrier 110 enables a higher tunneling magnetoresistance (TMR) ratio in the pMTJ device 104. In an embodiment, tunnel barrier 110 is MgO and has a thickness in the range between 1 nm to 2 nm.

In an embodiment, the fixed magnet 112 includes magnetic materials with sufficient perpendicular magnetization. In an embodiment, the fixed magnet 112 of the MTJ device 104 includes alloys such as CoFe, CoFeB, FeB. The alloys of CoFe, CoFeB, FeB may include doping with one or more of Ta, Hf, W, Mo, Ir, Ru, Si or C, to promote high perpendicular anisotropy. Alternatively, the alloys of CoFe, CoFeB, FeB may include thin layers of W, Ta or Molybdenum to promote high perpendicular anisotropy. In an embodiment, the fixed magnet 112 comprises a $Co_{100-x-y}Fe_xB_y$, where X and Y each represent atomic percent, further where X is between 50-80 and Y is between 10-40, and further where the sum of X and Y is less than 100. In one specific embodiment, X is 60 and Y is 20. In an embodiment, the fixed magnet 112 is FeB, where the concentration of boron is between 10-40 atomic percent of the total composition of the FeB alloy. In an embodiment the fixed magnet 112 has a thickness that is between 1 nm-3 nm.

Figure 1G:
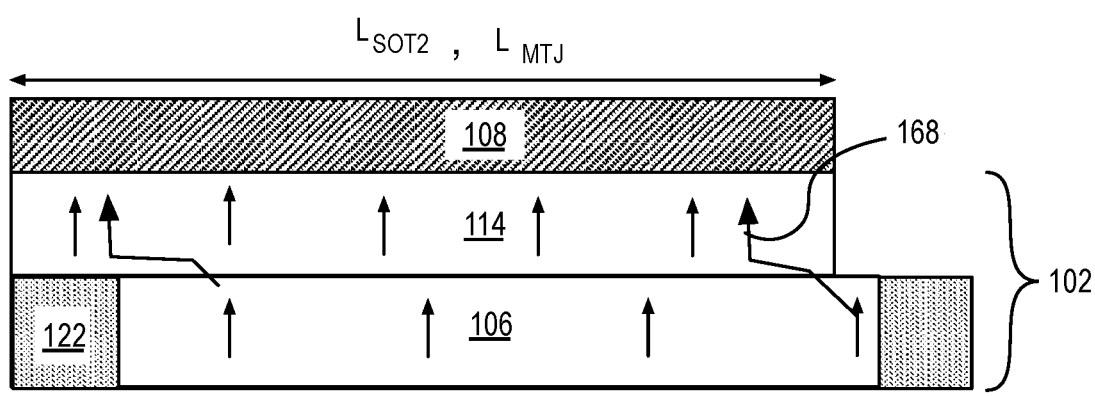
FIG. 1G illustrates a cross-sectional view of a portion of a SOT device in FIG. 1F, where the, second SOC layer is misaligned from the first SOC layer along a width of the second SOC layer.

FIG. 1G illustrates a cross-sectional view depicting the free magnet 108 of the MTJ device 104 having a direction of magnetization (denoted by the direction of the arrow 154) that is anti-parallel to a direction of magnetization (denoted by the direction of the arrow 156) in the fixed magnet 112. When the direction of magnetization 154 in the free magnet 108 is opposite (anti-parallel) to the direction of magnetization 156 in the fixed magnet 112, the MTJ device 104 device is said to be in a high resistance state.

Figure 1H:
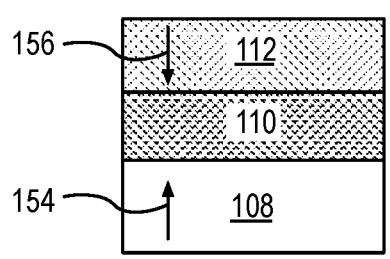
FIG. 1H illustrates a cross-sectional view depicting the direction of magnetization in a free magnet relative to the direction of magnetization in a fixed magnetic layer, in accordance with an embodiment of the present disclosure.
Figure 1I:
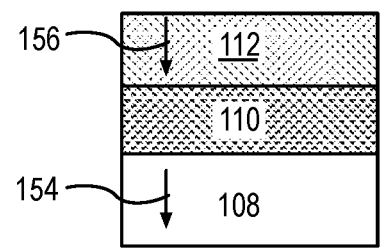
FIG. 1I illustrates a cross-sectional view depicting the direction of magnetization in a free magnet relative to the direction of magnetization in a fixed magnetic layer, in accordance with an embodiment of the present disclosure.
Figure 1J:
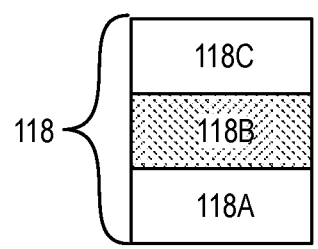
FIG. 1J illustrates a cross-sectional view of individual layers of a synthetic antiferromagnetic structure, in accordance with an embodiment of the present disclosure.

Conversely, FIG. 1H illustrates a cross-sectional view depicting the free magnet 108 of the MTJ device 104 having a direction of magnetization (denoted by the direction of the arrow 154) that is parallel to a direction of magnetization (denoted by the direction of the arrow 156) in the fixed magnet 112. When the direction of magnetization 154 in the free magnet 108 is parallel to the direction of magnetization 156 in the fixed magnet 112, the MTJ device 104 is said to be in a low resistance state.

In an embodiment, the free magnet 108 and the fixed magnet 112 can have approximately similar thicknesses and an injected spin polarized current which changes the direction of the magnetization 154 in the free magnet 108 can also affect the magnetization 156 of the fixed magnet 112. In an embodiment, to make the fixed magnet 112 more resistant to accidental flipping the fixed magnet 112 has a higher magnetic anisotropy than the free magnet 108. To reduce the stray field acting on the free magnet a synthetic antiferromagnetic (SAF) structure may be utilized. Referring once again to FIG. 1A, MTJ device 104 further includes a synthetic antiferromagnetic (SAF) structure 118 between the electrode 120 and the fixed magnet 112.

FIG. 1H illustrates a cross-sectional view of the SAF structure 118, in an accordance of an embodiment of the present disclosure. In an embodiment, the SAF structure 118 includes a non-magnetic layer 118B sandwiched between a first pinning ferromagnet 118A and a second pinning ferromagnet 118C as depicted in FIG. 1D. The first pinning ferromagnet 118A and the second pinning ferromagnet 118C are anti-ferromagnetically coupled to each other. In an embodiment, the first pinning ferromagnet 118A includes a layer of a magnetic metal such as Co, Ni, Fe. The first pinning ferromagnet 118A may also include alloys of magnetic metals such as Co, Ni, Fe such as CoFe, CoFeB or FeB. In other embodiments the first pinning ferromagnet 118A includes a bilayer of a magnetic/non-magnetic metals such but not limited to Co/Pd or a Co/Pt. In an embodiment, the second pinning ferromagnet 118C includes a layer of a magnetic metal such as Co, Ni, Fe. The second pinning ferromagnet 118C may also include alloys of magnetic metals such as Co, Ni, Fe such as CoFe, CoFeB or FeB. In other embodiments the second pinning ferromagnet 118C includes a bilayer of a magnetic/non-magnetic metals such but not limited to Co/Pd or a Co/Pt.

In an embodiment, the non-magnetic layer 118B includes a ruthenium or an iridium layer. In an embodiment, a ruthenium based non-magnetic layer 118B has a thickness between 0.3-1.0 nm to ensure that the coupling between the first pinning ferromagnet 118A and the second pinning ferromagnet 118C is anti-ferromagnetic (AF) in nature.

It is to be appreciated that an additional layer of non-magnetic spacer layer may exist between the fixed magnet 112 and the AF structure 118 (not illustrated in FIG. 1A). A non-magnetic spacer layer enables coupling between the SAF structure 118 and the fixed magnet 112. In an embodiment, a non-magnetic spacer layer may include a metal such as Ta, Ru or Ir. Referring again to FIG. 1A, the MTJ device 104 further includes an electrode 120 on the SAF structure 118. In an embodiment, the electrode 120 includes a material such as Ta or TiN. In an embodiment, the electrode 120 has a thickness between 5 nm and 70 nm.

Referring again to FIG. 1A, in an embodiment, the substrate 126 includes a suitable semiconductor material such as but not limited to, single crystal silicon, polycrystalline silicon and silicon on insulator (SOI). In another embodiment, substrate 126 includes other semiconductor materials such as germanium, silicon germanium or a suitable group III-N or a group III-V compound. Logic devices such as MOSFET transistors and access transistors and may be formed on the substrate 126. Logic devices such as access transistors may be integrated with memory devices such as SOT memory devices to form embedded memory. Embedded memory including SOT memory devices and logic MOSFET transistors can be combined to form functional integrated circuits such as a system on chip.

In the illustrative embodiment in FIG. 1A, the MTJ device 104 is surrounded by a dielectric layer 140. In some examples, such as is shown, the dielectric layer may also be directly on the first SOC layer 106. In an embodiment, the dielectric layer 403 includes an electrically insulating material such as, but not limited to, silicon dioxide, silicon nitride, silicon carbide, or carbon doped silicon oxide. When the dielectric layer is a material including oxygen, a portion including the uppermost surface 106A proximal to the dielectric layer 140 may include oxygen. In some instances, the entire uppermost surface of the first SOC layer 106 may include oxygen.

The SOT electrode 102 is also electrically coupled with conductive interconnects 128 and 130 to enable formation of a spin diffusion current during operation of SOT device 100. In the illustrative embodiment, the conductive interconnect 128 and conductive interconnect 130 are coupled to opposite ends of the SOT electrode 102. The conductive interconnect 128 and conductive interconnect 130 are directly in contact with the conductive layer 122. In an embodiment, the conductive interconnects 128 and 130 each include a barrier layer, such as tantalum nitride, and a fill metal, such as copper, tungsten or ruthenium.

In other embodiments, (not illustrated) the conductive interconnect 128 may couple the conductive layer 122 from below and the conductive interconnect 130 couple the first SOC layer 106 from above.

In an embodiment, the substrate 126 includes a suitable semiconductor material such as but not limited to, single crystal silicon, polycrystalline silicon and silicon on insulator (SOI). In another embodiment, substrate 126 includes other semiconductor materials such as germanium, silicon germanium or a suitable group III-N or a group III-V compound. In the illustrative embodiment, the substrate 126 includes a layer of dielectric material above a semiconductor material such as but not limited to, single crystal silicon, polycrystalline silicon, silicon germanium or a suitable group III-N or a group III-V compound. Logic devices such as MOSFET transistors and access transistors and may be formed on the substrate 126. Logic devices such as access transistors may be integrated with memory devices such as SOT memory devices to form embedded memory. Embedded memory including SOT memory devices and logic MOSFET transistors can be combined to form functional integrated circuits such as a system on chip.

Figure 2:
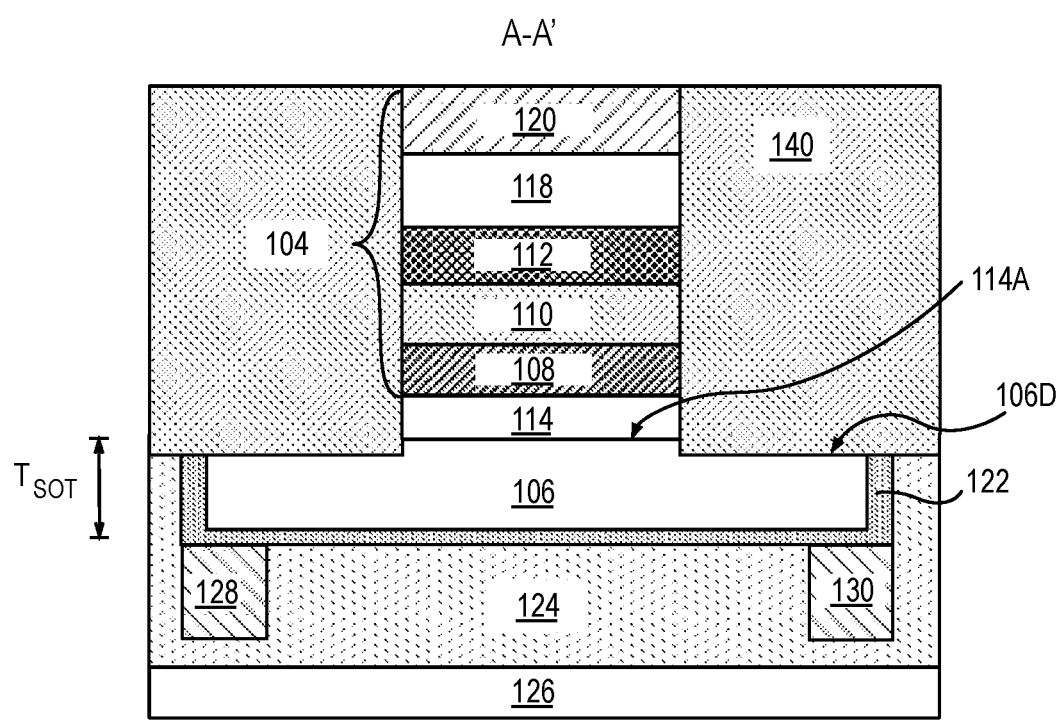
FIG. 2 illustrates a cross-sectional view of a SOT memory device, where a portion of the SOT electrode is recessed below a lowermost surface of the MTJ device, in accordance with an embodiment of the present disclosure.

In some embodiments, an uppermost surface 106D of the first SOC layer 106 not covered by the second SOC layer 114 is recessed below a lowermost surface 114A of the second SOC layer 114, as illustrated in FIG. 2. In some such embodiments, the amount of recess is less than a thickness of the remaining first layer. For instance, when the first SOC layer 106 is between 4 nm and 10 nm, the recess may range from 1 nm-2 nm. In other examples, the recess may be as much as 4 nm when the first SOC layer 106 is between 8 nm and 10 nm. A recess between 1 nm-4 nm in the first SOC layer 106 does not appreciably diminish the effect of the spin diffusion current generated in the first SOC layer 106.

Figure 3A:
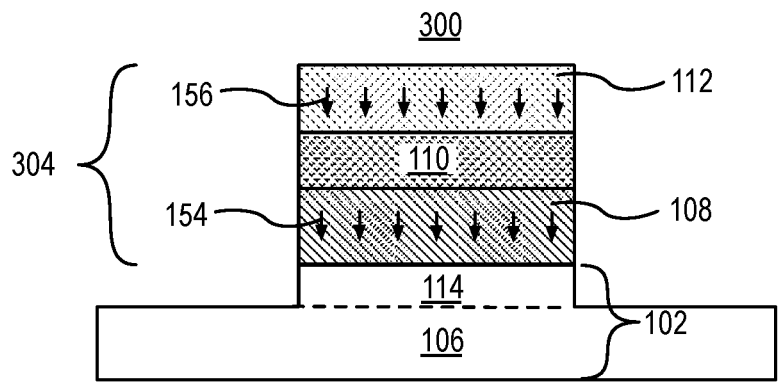
FIG. 3A illustrates a SOT memory device in a low resistance state.
Figure 3B:
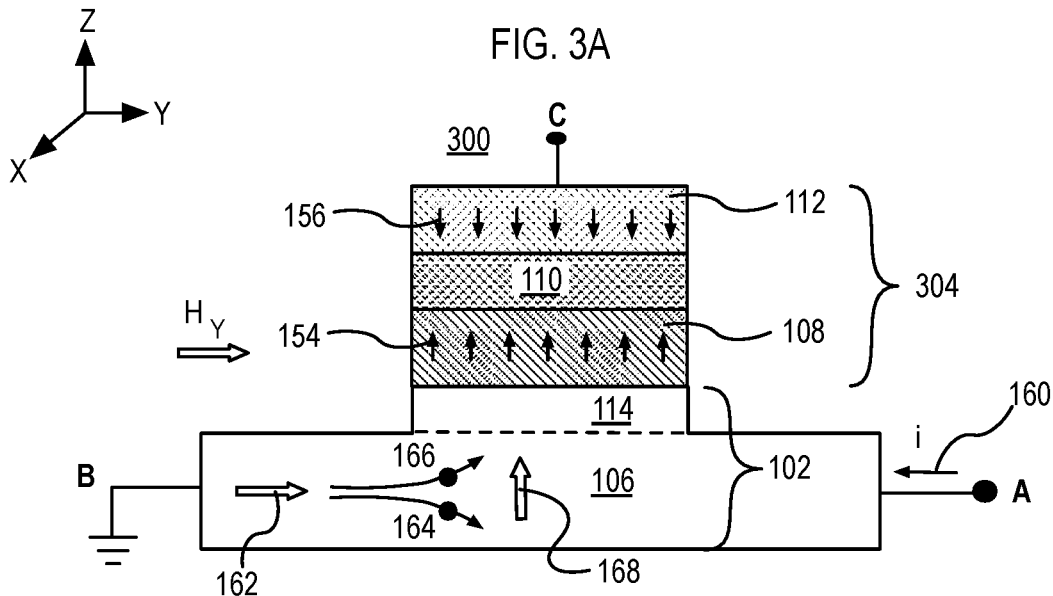
FIG. 3B illustrates a SOT memory device switched to a high resistance state after the application of a spin hall current, a spin torque transfer current and/or an external magnetic field.
Figure 3C:
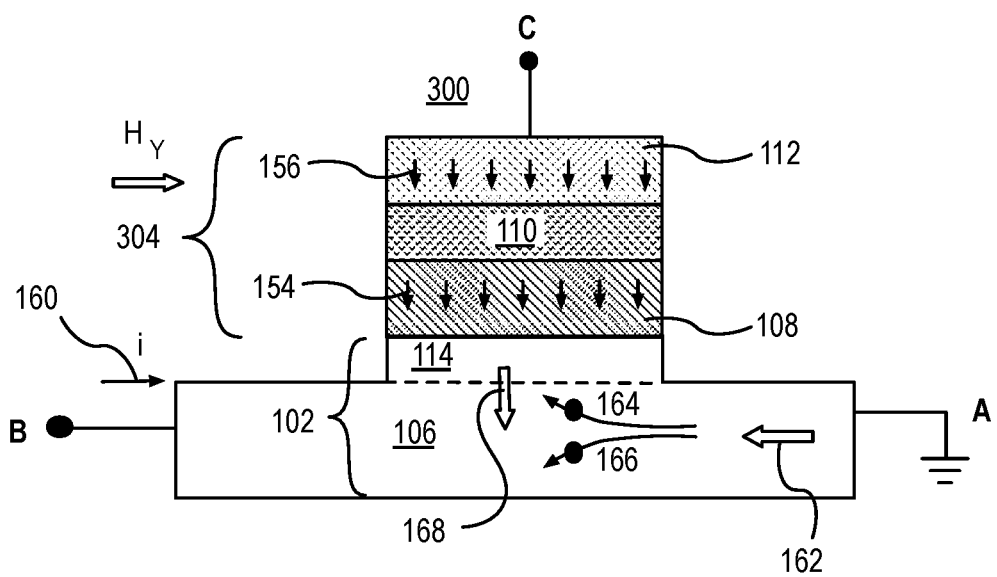
FIG. 3C illustrates a SOT memory device switched to a low resistance state after the application of a spin hall current, a spin torque transfer current and/or an external magnetic field.

FIGS. 3A-3C illustrate a mechanism for switching a spin orbit torque (SOT) memory device such as a spin orbit torque (SOT) memory device 300 including a MTJ device 104 on the SOT electrode 102 including the first SOC layer 106 and the second SOC layer 114. In the illustrative embodiment, the MTJ device 304 includes one or more features of the MTJ device 104, such as the free magnet 108, the fixed magnet 112 and the tunnel barrier 110 between the free magnet 108, the fixed magnet 112.

FIG. 3A illustrates a SOT memory device 300 including the MTJ device 304 on the SOT electrode 102, where a magnetization 154 of the free magnet 108 is aligned in a direction parallel to the magnetization 156 of the fixed magnet 112. In an embodiment, the direction of magnetization 154 of the free magnet 108 and the direction of magnetization 156 of the fixed magnet 112 are both in the negative Z-direction as illustrated in FIG. 3A. As discussed above, when the magnetization 154 of the free magnet 108 is in the same direction as a magnetization 156 of the fixed magnet 112, MTJ device 104 is in a low resistance state.

FIG. 3B illustrates the MTJ device 104 of the spin orbit torque (SOT) memory device 300 switched to a high resistance state. In an embodiment, a reversal in the direction of magnetization 154 of the free magnet 108 in FIG. 3B relative to the direction of magnetization 154 of the free magnet 108 in FIG. 3A is brought about by (a) inducing a spin diffusion current 168 in the SOT electrode 102 in the Y-direction, (by applying a positive voltage bias on terminal A with respect to a grounded terminal B), and/or (c) by applying an external magnetic field, $H_y$, 170 in the Y-direction.

In an embodiment, a charge current 160 is passed through the SOT electrode 102 in the negative y-direction. In response to the charge current 160, an electron current 162 flows in the positive y-direction. The electron current 162 includes electrons with two opposing spin orientations, a type I electron 166, having a spin oriented in the negative x-direction and a type II electron 164 having a spin oriented in the positive X-direction. In an embodiment, electrons in the electron current 162 experience a spin dependent scattering phenomenon in the SOT electrode 102. The spin dependent scattering phenomenon is brought about by a spin-orbit interaction between the nucleus of the atoms in the SOT electrode 102 and the electrons in the electron current 162. The spin dependent scattering phenomenon causes type I electrons 166, whose spins are oriented in the negative x-direction (into the page of FIG. 3B), to be deflected upwards towards an uppermost portion of the SOT electrode 102 and type II electrons 164 whose spins are oriented in the positive X-direction to be deflected downwards towards a lowermost portion of the SOT electrode 102. The separation between the type I electrons 166 and the type II electrons 164 induces a polarized spin diffusion current 168 in the SOT electrode 102. In an embodiment, the polarized spin diffusion current 168 is directed upwards toward the free magnet 108 of the MTJ device 104, as is depicted in FIG. 3B. The polarized spin diffusion current 168 induces a Spin Hall torque on the magnetization 154 of the free magnet 108. In an embodiment, a torque can also be exerted on the magnetization 154 of the free magnet 108 by applying an external magnetic field, $H_Y$, in the Y-direction, as illustrated in FIG. 3B. In the illustrative embodiment, the external magnetic field, $H_Y$, provides a torque component (in the positive Z direction) to switch the magnetization 154 of the free magnet 108.

FIG. 3C illustrates the MTJ device 104 of the spin orbit torque (SOT) memory device 300 switched to a low resistance state. In an embodiment, a reversal in the direction of magnetization 154 of the free magnet 108 in FIG. 3C compared to the direction of magnetization 154 of the free magnet 108 in FIG. 3B is brought about by (a) reversal in the direction of the spin diffusion current 168 in the SOT electrode 102 (by applying a positive voltage bias on terminal B with respect to a grounded terminal A), and/or (b) by applying an external magnetic field, $H_y$, 170 in the negative Y-direction. In some embodiments, the direction of the external magnetic field, $H_y$ is not reversed (not shown.)

A read operation to determine a state of the MTJ device 104 may be performed by voltage biasing a third terminal C, connected to the fixed magnet 112 with respect to either terminal A or B, where the terminals A or B are grounded (not illustrated).

Figure 4:
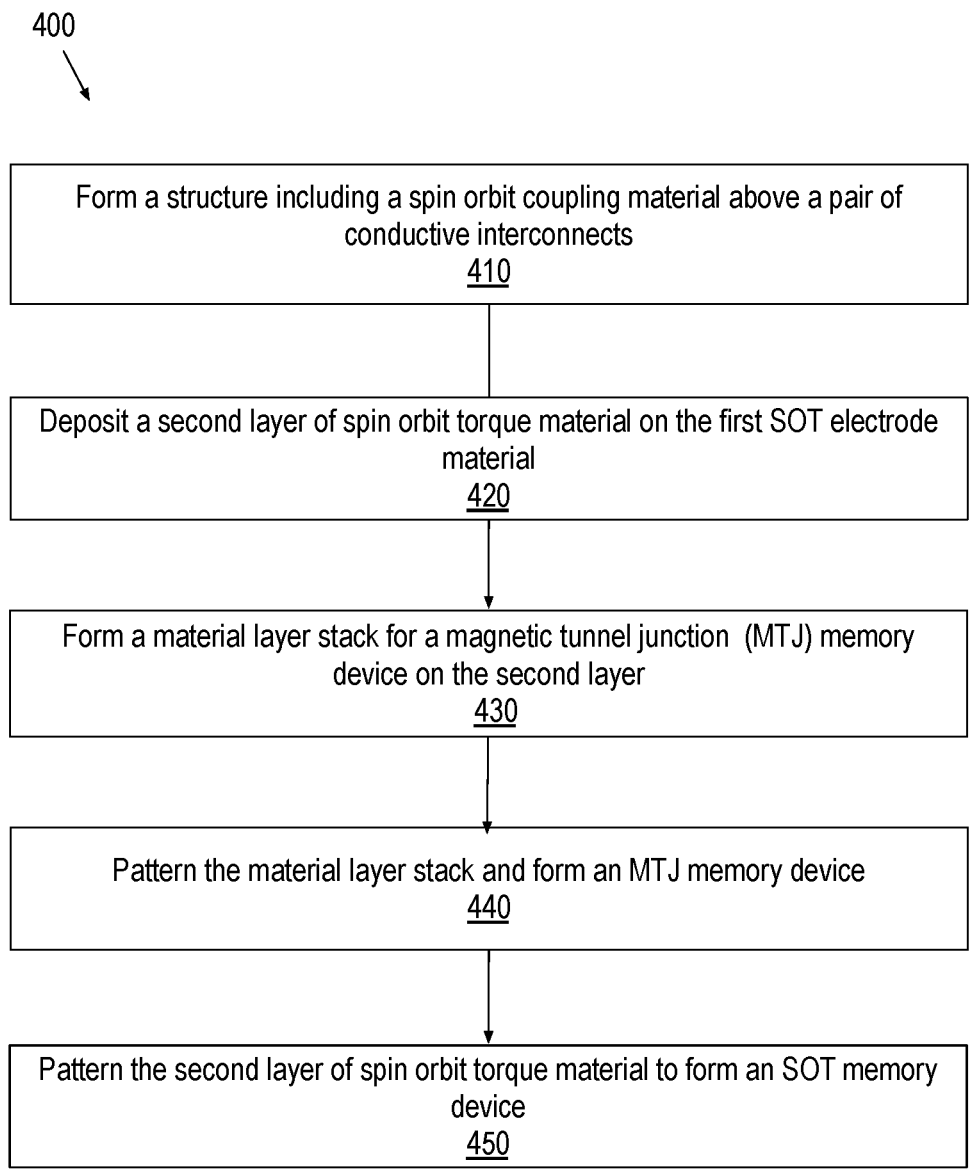
FIG. 4 is a flow diagram depicting a method to fabricate a SOT memory device, in accordance with an embodiment of the present disclosure.

FIG. 4 illustrates a flow diagram of a method to fabricate a SOT memory device. The method 400 begins at operation 410 by forming a SOC structure including a first SOC material above a pair of conductive interconnects above a substrate. In some embodiments, the SOC structure is formed in a dielectric layer above the pair of conductive interconnects by a damascene process that entails a vacuum break. The method 400 continues at operation 420 with the formation of a layer of second SOC material on the SOC structure.

The method 400 continues at operation 430 with the formation of a material layer stack for the formation of an MTJ device on the second SOC material. In exemplary embodiments, all layers in the material layer stack and the second SOC material are blanket deposited in-situ without breaking vacuum. In a simplest embodiment, forming the material layer stack includes a deposition of a free magnetic layer on the second SOC material, deposition of a tunnel barrier layer deposited over the free magnetic layer, deposition of a fixed magnetic layer over the tunnel barrier layer, deposition of layers of a synthetic antiferromagnetic (SAF) structure over the fixed magnetic layer, and deposition of a conductive material on the layers of a synthetic antiferromagnetic (SAF) structure.

The method 400 is continued at operation 440 with patterning of the material layer stack to form a MTJ device. The method 400 is then resumed at operation 450 with the patterning of the second SOC material to form a SOT electrode and a SOT memory device.

FIGS. 5A-5K illustrate cross-sectional views representing various operations in a method of fabricating a SOT memory device, such as the SOT memory device 100 in accordance with embodiments of the present disclosure.

Figure 5A:
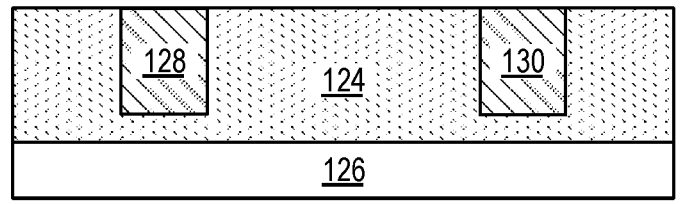
FIG. 5A illustrates a pair of conductive interconnects formed in a dielectric layer above a substrate, in accordance with embodiments of the present disclosure.

FIG. 5A illustrates the structures of conductive interconnects 128 and 130 surrounded by a dielectric layer 124 formed above a substrate 126. In an embodiment, the conductive interconnects 128 and 130 are formed in a dielectric layer 124 by a damascene or a dual damascene process. In an embodiment, the conductive interconnect 130 includes a barrier layer, such as titanium nitride, ruthenium, tantalum, tantalum nitride, and a fill metal, such as copper, tungsten. In an embodiment, the conductive interconnects 128 and 130 are fabricated using a subtractive etch process when materials other than copper are utilized. In one such embodiment, the conductive interconnects 128 and 130 include a material such as but not limited to titanium nitride, ruthenium, tantalum, tantalum nitride. In some examples, the dielectric layer 124 includes a material such as but not limited to silicon dioxide, silicon nitride, silicon carbide, or carbon doped silicon oxide. In an embodiment, the dielectric layer 124 has an uppermost surface substantially co-planar with an uppermost surface of the conductive interconnects 128 and 130. Depending on embodiments, the dielectric layer 124 has a total thickness between 70 nm-120 nm. In some examples, at least one of the conductive interconnects 128 or 130 is electrically connected to a circuit element such as an access transistor (not shown). Logic devices such as access transistors may be integrated with memory devices such as a SOT device to form embedded memory.

Figure 5B:
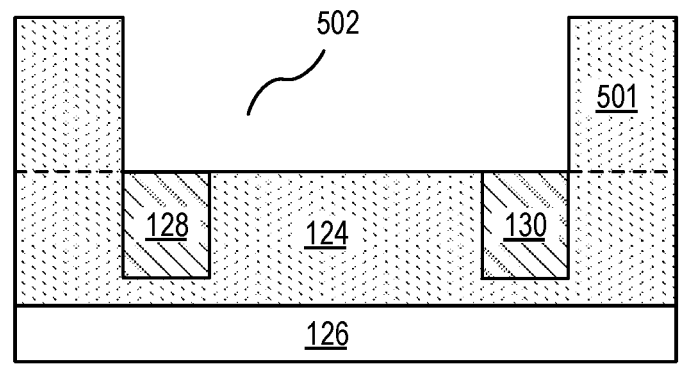
FIG. 5B illustrates a cross-sectional view of the structure in FIG. 5A following the formation of a second dielectric layer on the pair of conductive interconnects and following the formation of an opening in the second dielectric layer to expose the pair of conductive interconnects.

FIG. 5B illustrates a cross-sectional view of the structure in FIG. 5A following the formation of a second dielectric layer 501 on the conductive interconnects 128 and 130 and following the formation of an opening 502 in the dielectric layer 501 to expose the conductive interconnects 128 and 130. The dielectric layer 501 may be the same or substantially the same as the dielectric layer 124. In other examples, dielectric layer 501 may include a material such as silicon nitride, silicon oxynitride or a carbon doped silicon nitride. The opening 502 may be formed by forming a mask on the dielectric layer 501 and then etching the dielectric layer 501 exposed by the mask. A plasma etch process may be utilized to perform the etching. By selecting a dielectric layer 501 that is different in composition compared to the underlying dielectric layer 124, the etch can be controllably stopped on the dielectric layer 124. The opening 502 has a shape that substantially determines the shape of a lower portion of an SOT electrode to be subsequently formed. Depending on embodiments, the opening 502 has a depth between 5 nm and 30 nm.

Figure 5C:
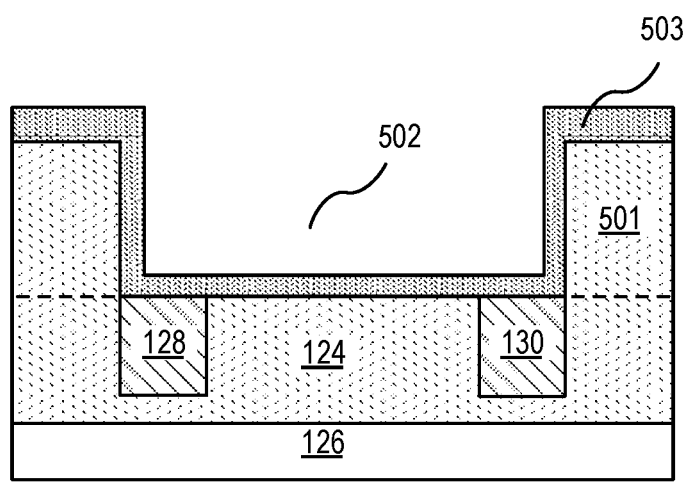
FIG. 5C illustrates a cross-sectional view of the structure in FIG. 5B following the formation of a conductive layer in the opening and on the pair of conductive interconnects.

FIG. 5C illustrates a cross-sectional view of the structure in FIG. 5B following the formation of a conductive layer 503 in the opening 502 and on conductive interconnects 128 and 130. In an embodiment, the conductive layer 503 is blanket deposited in the opening 502, on conductive interconnects 130, on the dielectric layer 124 and on the dielectric layer 501. In an embodiment, the conductive layer 503 includes a material that is the same as or substantially the same as the material of the conductive layer 122. The conductive layer 122 may function as a polish stop layer in a subsequent downstream operation. In some embodiments, the conductive layer 122 may also act as a diffusion barrier between the conductive interconnects 128 and 130.

Figure 5D:
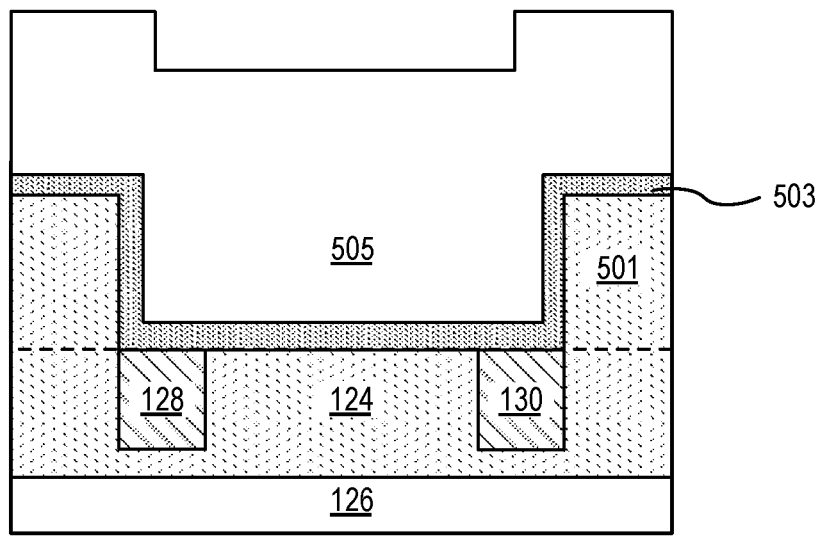
FIG. 5D illustrates a cross-sectional view of the structure in FIG. 5C following the deposition of a first layer including a SOT material.

FIG. 5D illustrates a cross-sectional view of the structure in FIG. 5C following the deposition of a first layer 505 including a spin orbit coupling material (herein, first SOC layer 505) in the opening 502 and on the conductive layer 503. In an embodiment, the first SOC layer 505 is blanket deposited using a physical vapor deposition (PVD) or a chemical vapor deposition (CVD) process. In an embodiment, the first SOC layer 505 includes a material that is the same as or substantially the same as the material of the first SOC layer 106.

Figure 5E:
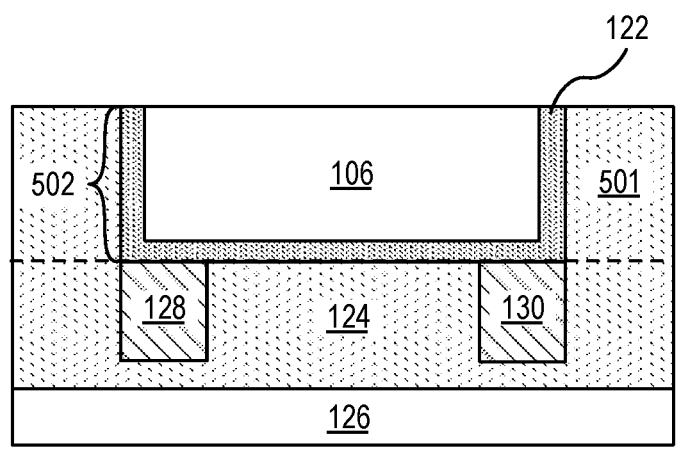
FIG. 5E illustrates a cross-sectional view of the structure in FIG. 5D following the planarization of the first layer including a SOT material, the second dielectric layer and the conductive layer.

FIG. 5E illustrates a cross-sectional view of the structure in FIG. 5D following the planarization of the first SOC layer 505, the dielectric layer 501 and the conductive layer 503.

A planarization process is carried out to remove the first SOC layer 505 and the conductive layer 503 above the dielectric layer 501. Uppermost portions of the of dielectric layer 501 are also removed during the planarization process. The planarization process forms the first SOC layer 106 and the conductive layer 122 in the opening 502. In the illustrative embodiment, dielectric layer 501, the conductive layer 503 and the first SOC layer 106 have uppermost surfaces that are co-planar or substantially co-planar following the planarization process. In an embodiment, the planarization process is a chemical mechanical polish process. In an example, the planarization process forms a first SOC layer 106 having a topographically smooth uppermost surface with a surface roughness that is less than 0.5 nm. In an embodiment, the first SOC layer 106 has a resultant thickness between 4 nm-10 nm after the planarization process. Hence, the uppermost surface of the first SOC layer 106 may be exposed to a non-vacuum environment after the planarization process, but prior to depositing the second SOC layer 507. Oxygen may therefore be introduced onto, or into, first SOC layer 106, for example. In an embodiment, the uppermost surface of the first SOC layer 106 getters oxygen from the non-vacuum ambient transforming at least a portion of the first SOC layer 106 at an interface 105 with the second SOC layer 507 into a material including oxygen.

Figure 5F:
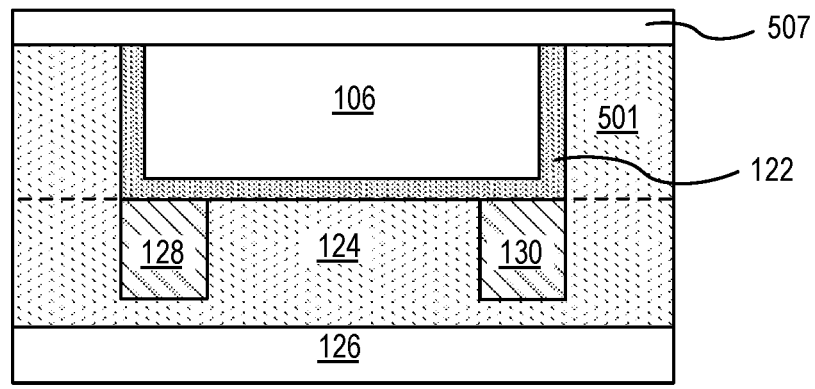
FIG. 5F illustrates a cross-sectional view of the structure in FIG. 5E following the formation of second layer including a SOT material on the planarized first layer.

FIG. 5F illustrates a cross-sectional view of the structure in FIG. 5E following the formation of a second SOC layer 507 on the planarized first SOC layer 106 and on an uppermost surface of the dielectric layer 501. In an embodiment, the second SOC layer 507 is blanket deposited using a PVD process. In some embodiments, the PVD deposition process utilized to form the second SOC layer 507 begins with a sputter clean process. In some examples the sputter clean may include atoms of Ar. The sputter clean process may be effective in removing some material including oxygen formed on the uppermost surface of the first SOC layer 106. However, to avoid prolonged damage to the first SOC layer 106 such a sputter clean may limited in effect. Processing parameters such as duration of the sputter clean process and processing pressures may be adjusted depending on the material of the first SOC layer 106. In some examples, such as is illustrated, at least a portion of the first SOC layer 106 at an interface 105 includes oxygen. If present, oxygen may also diffuse into the second SOC layer 507, for example from the SOC layer 106 during a subsequent thermal anneal, etc. In other instances, the sputter clean is successful in removing portions of the material including oxygen from the uppermost surface of the first SOC layer 106.

As discussed above in association with FIG. 1D, an uppermost portion of the conductive layer 122 may also include oxygen. For example, where the sputter clean may or may not remove all material that includes oxygen from the uppermost surface of the conductive layer 122 prior to deposition of the second SOC layer 507.

Figure 5G:
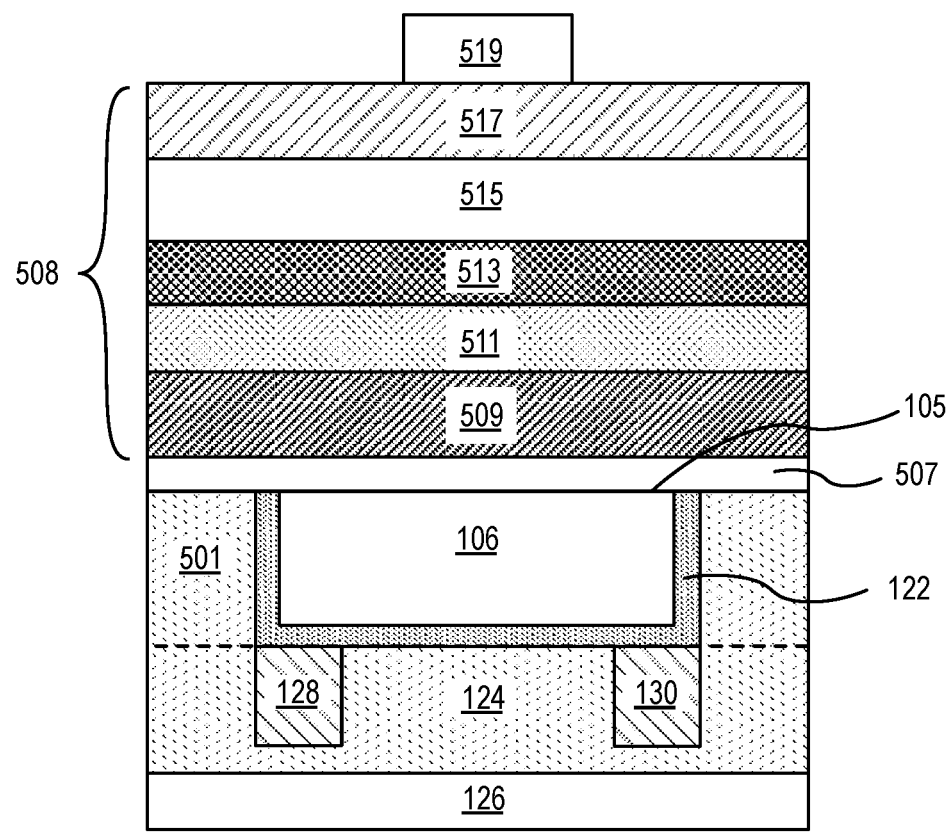
FIG. 5G illustrates a cross-sectional view of the structure in FIG. 5F following the formation of a material layer stack for the formation of a MTJ device on the second layer.

FIG. 5G illustrates a cross-sectional view of the structure in FIG. 5F following the formation of a MTJ material layer stack 508 on the second SOC layer 507. The deposition process begins by first depositing a free magnetic layer 509 on the second SOC layer 507. In an embodiment, the free magnetic layer 509 is deposited using a PVD process or a plasma enhanced chemical vapor deposition process. In an embodiment, the free magnetic layer 509 includes a material that is the same or substantially the same as the material of the free magnet 108. In an embodiment, the deposition process forms a free magnetic layer 509 including CoFeB that is amorphous. In an embodiment, the free magnetic layer 509 is deposited to a thickness between 0.9 nm-2.0 nm to fabricate a perpendicular MTJ device. During an in-situ deposition process, a tunnel barrier layer 511 is then formed on the free magnetic layer 509, a fixed magnetic layer 513 is formed on the tunnel barrier layer 511, layers of a SAF structure 515 is formed on the fixed magnetic layer 513 and a conductive layer 517 is formed on the layers of a SAF structure 515 to complete formation of a MTJ material layer stack 508 for a MTJ device.

In some embodiments, a tunnel barrier layer 511 is blanket deposited on the free magnetic layer 509. In an embodiment, the tunnel barrier layer 511 is a material including magnesium and oxygen or a material including aluminum and oxygen. In an exemplary embodiment, the tunnel barrier layer 511 is a layer of MgO and is deposited using a reactive sputter process. In an embodiment, the reactive sputter process is carried out at room temperature. In an embodiment, the tunnel barrier layer 511 is deposited to a thickness between 0.8 nm to 1 nm. In some examples, the deposition process is carried out in a manner that yields a tunnel barrier layer 511 having an amorphous structure. In some such examples, the amorphous tunnel barrier layer 511 becomes crystalline after performing a high temperature anneal process to be described further below. In other embodiments, the tunnel barrier layer 511 is crystalline as deposited.

In an embodiment, the fixed magnetic layer 513 is blanket deposited on an uppermost surface of the tunnel barrier layer 511. In an embodiment, the deposition process includes a physical vapor deposition (PVD) or a plasma enhanced chemical vapor deposition process. In an embodiment, the PVD deposition process includes an RF or a DC sputtering process. In an exemplary embodiment, the fixed magnetic layer 513 is $Co_{100-x-y}Fe_xB_y$, where X and Y each represent atomic percent, further where X is between 50-80 and Y is between 10-40, and further where the sum of X and Y is less than 100. In some embodiments, the fixed magnetic layer 513 includes a material that is the same or substantially the same as the material of the fixed magnet 116 described above. In some examples, the fixed magnetic layer 513 may be deposited to a thickness between 2.0 nm and 3.0 nm. A thickness range between 2.0 nm and 3.0 nm may be sufficiently thin to provide perpendicular magnetic anisotropy required to fabricate a perpendicular MTJ device.

In the illustrative embodiment, the material layer stack deposition process is continued layers of a SAF structure 515 are blanket deposited on the fixed magnetic layer 513 using a PVD process. The layers of a SAF structure 515 are the same or substantially the same as the layers in the SAF structure 118 described above.

In an embodiment, the deposition process concludes with a blanket deposition of a conductive layer 517 on an uppermost surface of the layers of a SAF structure 515. In an embodiment, the conductive layer 517 includes a material that is suitable to act as a hardmask during a subsequent etching of the MTJ material layer stack 508 to form a SOT device. In an embodiment, the conductive layer 517 includes a material such as TiN, Ta or TaN. In an embodiment, the thickness of the top electrode layer ranges from 5 nm-70 nm. The thickness of the conductive layer 517 is chosen to accommodate patterning of the MTJ material layer stack 508 to form a MTJ device.

In an embodiment, after all the layers in the MTJ material layer stack 508 are deposited, an anneal is performed under conditions well known in the art. In an embodiment, the anneal process enables formation of a crystalline MgO-tunnel barrier layer 511 to be formed. In an embodiment, the anneal is performed immediately post deposition but before patterning of the MTJ material layer stack 508. A post-deposition anneal of the MTJ material layer stack 508 is carried out in a furnace at a temperature between 300-350 degrees Celsius in a forming gas environment. In an embodiment, the forming gas includes a mixture of $H_2$ and $N_2$ gas.

In an embodiment, the annealing process promotes solid phase epitaxy of the free magnetic layer 509 to follow a crystalline template of the tunnel barrier layer 511 (e.g., MgO) that is directly above the free magnetic layer 509. In an embodiment, the anneal also promotes solid phase epitaxy of the fixed magnetic layer 513 to follow a crystalline template of the tunnel barrier layer 511 (e.g., MgO) that is directly below the fixed magnetic layer 513. <001> Lattice matching between the tunnel barrier layer 511 and the free magnetic layer 509 and <001> lattice matching between the tunnel barrier layer 511 and the fixed magnetic layer 513 enables a TMR ratio of at least 90% to be obtained in the MTJ material layer stack 508.

In an embodiment, the annealing process is also performed in the presence of a magnetic field which sets a direction of magnetization of the fixed magnetic layer 513 and the free magnetic layer 509. In an embodiment, during the annealing process, an applied magnetic field that is directed perpendicular to a plane of MTJ material layer stack 508 enables a perpendicular anisotropy to be set in the fixed magnetic layer 513 and in the free magnetic layer 509. In an embodiment, the annealing process initially aligns the magnetization of the fixed magnetic layer 513 and magnetization of the free magnetic layer 509 to be parallel to each other and perpendicular to the plane of the MTJ material layer stack 508.

While one MTJ material layer stack 508 has been described in this embodiment, alternative material layer stacks may include layers of materials to form a composite free magnet having a multilayer magnet structure for advantageous device performance The method concludes by forming a mask 519 over the MTJ material layer stack 508. In some embodiments, the mask 519 includes a photoresist material. The mask defines a shape and size of a MTJ device and a location where the MTJ device is to be subsequently formed with respect the first SOC layer 106.

Figure 5H:
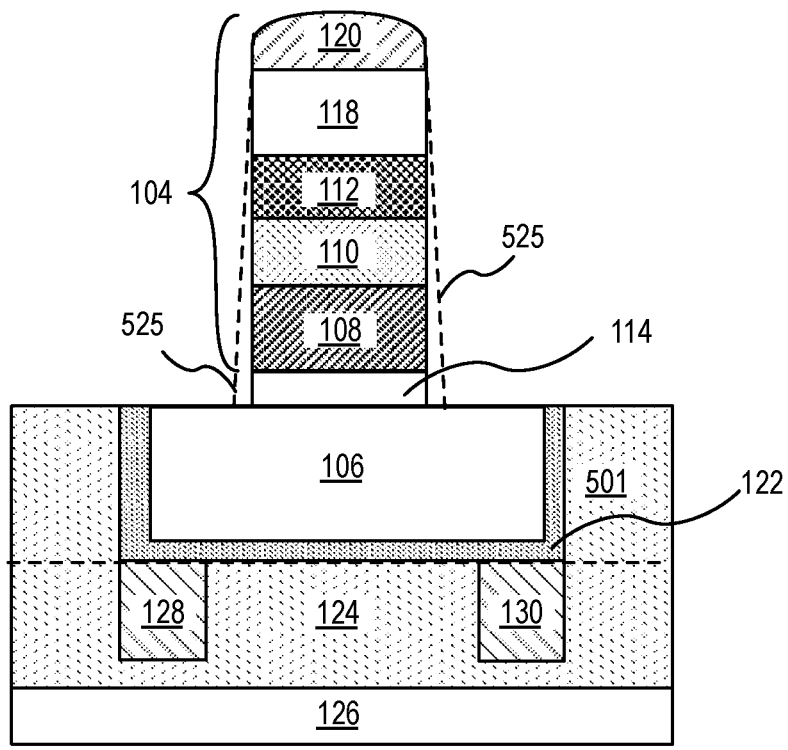
FIG. 5H illustrates a cross-sectional view of the structure in FIG. 5G following the process of etching the material layer stack to form a MTJ device and following etch of the second layer.

FIG. 5H illustrates a cross-sectional view of the structure in FIG. 5G following patterning and etching of the MTJ material layer stack 508. In an embodiment, the patterning process includes etching the conductive layer 517 by a plasma etch process to form an electrode 120. In other embodiments, the patterning process includes an ion milling process.

In an embodiment, the plasma etch process is then continued to pattern the remaining layers of the MTJ material layer stack 508 to form a MTJ device 104. The plasma etch process etches the various layers in the MTJ material layer stack 508 to form a SAF structure 118, a fixed magnet 116, a tunnel barrier 110 and a free magnet 108. The plasma etch process also exposes the second SOC layer 507. In some embodiments, depending on the etch parameters, the MTJ device 104 may have sidewalls that are tapered as indicated by the dashed lines 525.

Once the MTJ material layer stack 508 is etched an over etch process is implemented to continue patterning the second SOC layer 507 into the second SOC layer 114. In exemplary embodiments, the etch process is a timed and prevents over etching into the first SOC layer 106. It is to be appreciated that the portion of the interface between the first SOC layer 106 and the second SOC layer 507 that includes oxygen may act as an etch stop during etching the second SOC layer 507. In other embodiments, a small uppermost portion of the first SOC layer 106 is removed, resulting in a recess in the first SOC layer 106 as depicted in FIG. 2, above. It is to be appreciated that sidewalls of the second SOC layer 114 may have a slope that is different from a slope of the sidewalls of the MTJ device 104 from a less energetic etch process advantageously selected to prevent over etch into the first SOC layer 106.

Figure 5I:
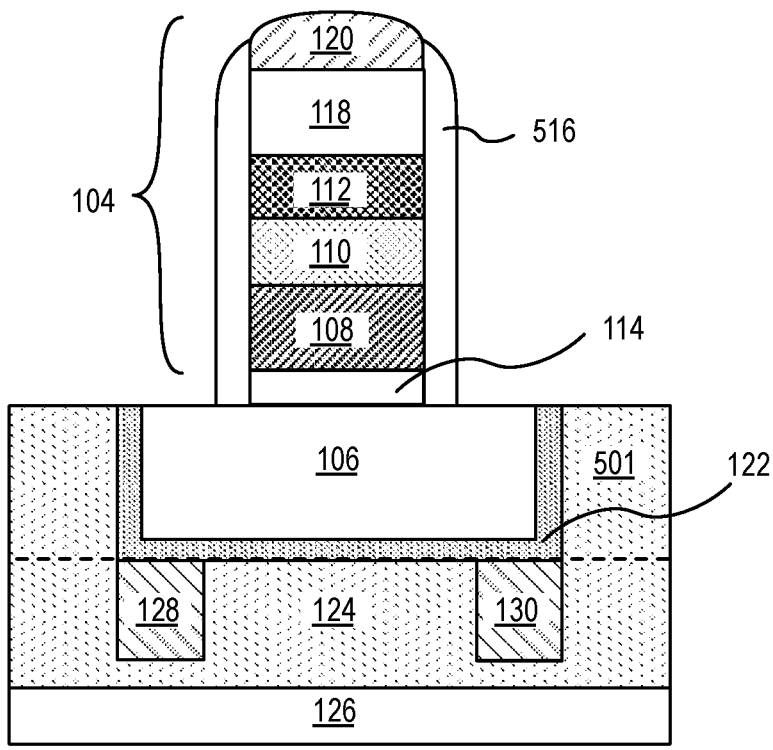
FIG. 5I illustrates a cross-sectional view of the structure in FIG. 5H following the formation of a dielectric spacer adjacent to the MTJ device, adjacent to sidewalls of the second layer and on portions of the first electrode.

FIG. 5I illustrates a cross-sectional view of the structure in FIG. 5H following the formation of a dielectric spacer 516 adjacent to the MTJ device 104. In an embodiment, a dielectric spacer layer is deposited on the electrode 120, on top and on sidewalls of MTJ device 104, on sidewalls of the second SOC layer 114, on the uppermost surface of the first SOC layer 106 and on the dielectric layer 102. In an embodiment, the dielectric spacer layer is deposited without a vacuum break following the plasma etch process. In an embodiment, the dielectric spacer layer includes a material such as, but not limited to, silicon nitride, carbon doped silicon nitride or silicon carbide. In an embodiment, the dielectric spacer layer includes an insulator layer that does not have an oxygen content to minimize potential oxidation of magnetic layers. In an embodiment, the dielectric spacer layer is etched by a plasma etch process forming dielectric spacer 516 on sidewalls of the electrode 120, on sidewalls of the MTJ device 104 and on sidewalls of the second SOC layer 114.

Figure 5J:
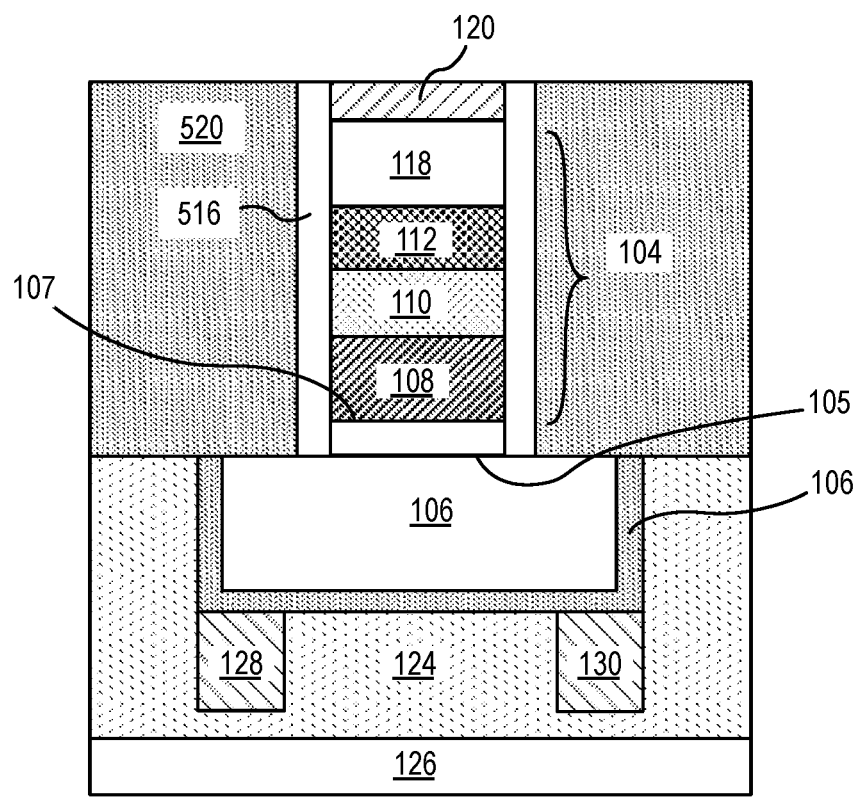
FIG. 5J illustrates a cross-sectional view of the structure in Figure SI following the formation of a third dielectric layer on the first layer and on the MTJ device followed by a planarization process.

FIG. 5J illustrates a cross-sectional view of the structure in FIG. 5I following the formation of a dielectric layer 140 adjacent to the MTJ device 104 and on the uppermost surface of the first SOC layer 106. In an embodiment, the dielectric layer 140 can include a material such as silicon oxide or carbon doped silicon oxide, silicon nitride or carbon doped nitride. In some examples, a dielectric layer is blanket deposited onto the structure of FIG. 5I and then planarized. The planarization process may remove uppermost portions of the electrode 120 and dielectric spacer 516.

Figure 6:
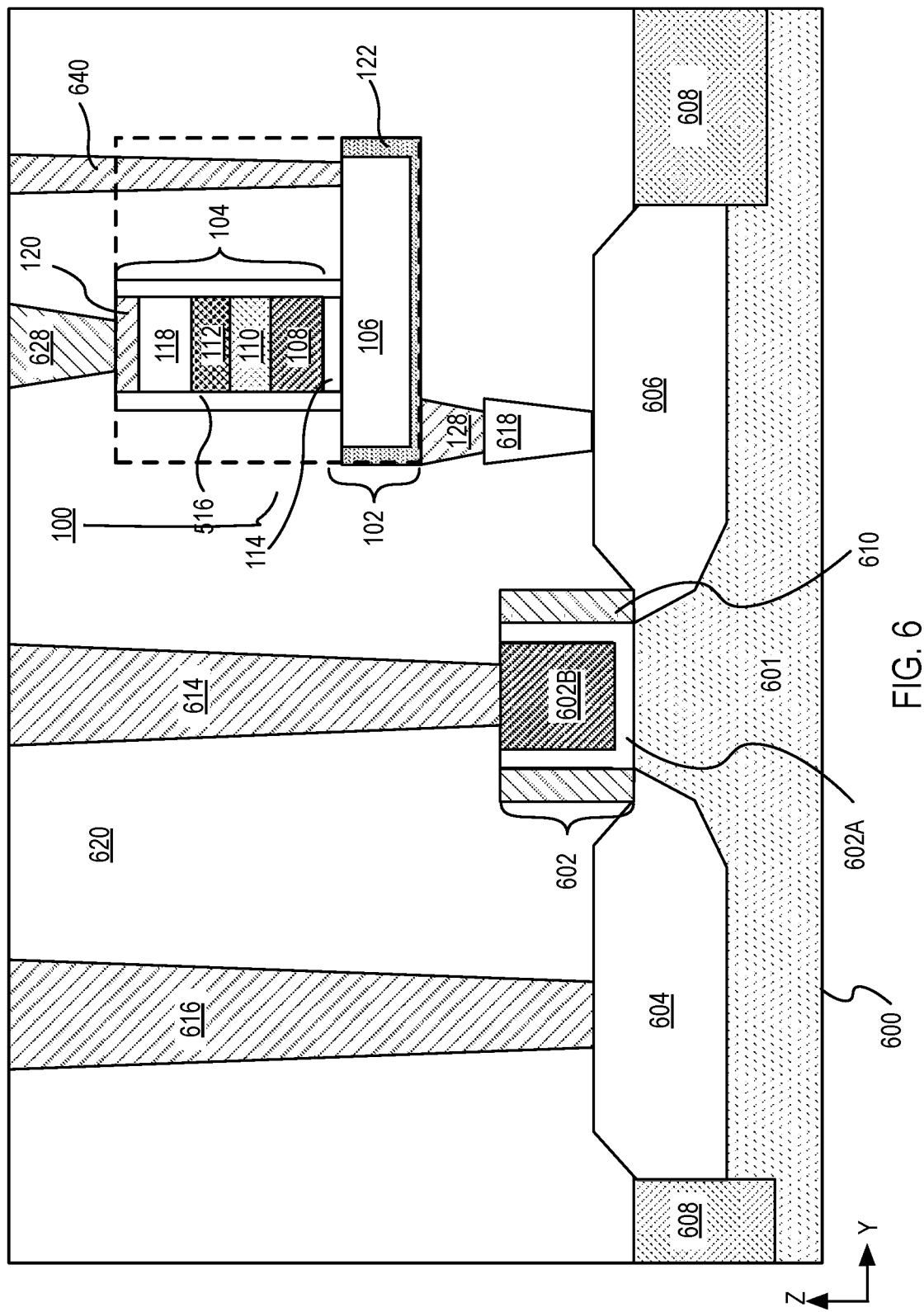
FIG. 6 illustrates a cross-sectional view of a SOT memory device having one terminal coupled to a drain of a transistor, a second terminal coupled to a second electrode and a third terminal coupled to the MTJ device.

FIG. 6 illustrates a SOT device coupled to an access transistor 1000. In an embodiment, the SOT memory device 100 includes a MTJ device 104 on a SOT electrode 102, described in association with FIGS. 1A and 2. The SOT memory device 100 may include one or more features of the SOT memory device 100 described above in embodiments, associated with FIGS. 1A-1J and in FIG. 2.

In an embodiment, the transistor 600 has a source region 604, a drain region 606 and a gate 602. The transistor 600 further includes a gate contact 614 above and electrically coupled to the gate 602, a source contact 616 above and electrically coupled to the source region 604, and a drain contact 618 above and electrically coupled to the drain region 606 as is illustrated in FIG. 6. In the illustrative embodiment, the MTJ device 104 includes the fixed magnet 112, the first electrode 120 coupled with the fixed magnet 112, the free magnet 108 and the tunnel barrier 110 between the free magnet 108 and the fixed magnet 112. The free magnet 108 of MTJ device 104 is coupled to the SOT electrode 102. The SOT electrode 102 includes the first SOC layer 106 including a spin orbit coupling material and has a first lateral length (along the Y axis). The SOT electrode 102 further includes the second SOC layer 114 including the spin orbit coupling material. The second SOC layer 114 is between the free magnet 108 and the first SOC layer 106 as illustrated in FIG. 6. The lowermost surface of the second SOC layer 114 is in contact with the first SOC layer 106 over a second lateral length (along the Y axis) that is smaller than the first lateral length. At least a portion of the first SOC layer 106 at an interface with the second SOC layer 114 includes oxygen.

In the illustrative embodiment, one portion of electrode 102 is in electrical contact with the drain contact 618 of transistor 600 through the conductive interconnect 128. A MTJ contact 628 is on and electrically coupled with the electrode 120 of the MTJ device 104. An interconnect metallization structure 640 is on and electrically coupled with the first SOC layer 106 of the electrode 102, and the MTJ device 104 is between the drain contact 618 and the interconnect metallization structure 640. In the illustrative embodiment, the MTJ device 104 is laterally between the drain contact 618 and interconnect metallization structure 640. In some embodiments, the MTJ device 104 is laterally closer to the drain contact 618 than to interconnect metallization structure 640. In other embodiments, the MTJ device 104 is laterally closer to the interconnect metallization structure 640 than to the drain contact 618. In some embodiments, the MTJ device 104 is approximately midway, laterally, between the interconnect metallization structure 640 and the drain contact 618.

In an embodiment, the underlying substrate 601 represents a surface used to manufacture integrated circuits. Suitable substrate 601 includes a material such as single crystal silicon, polycrystalline silicon and silicon on insulator (SOI), as well as substrates formed of other semiconductor materials. In some embodiments, the substrate 601 is the same as or substantially the same as the substrate 126. The substrate 601 may also include semiconductor materials, metals, dielectrics, dopants, and other materials commonly found in semiconductor substrates.

In an embodiment, the transistor 600 associated with substrate 601 are metal-oxide-semiconductor field-effect transistors (MOSFET or simply MOS transistors), fabricated on the substrate 601. In some embodiments, the transistor 600 is an access transistor 600. In various implementations of the invention, the transistor 600 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the access transistor 600 of substrate 601 includes a gate 602. In some embodiments, gate 602 includes at least two layers, a gate dielectric layer 602A and a gate electrode 602B. The gate dielectric layer 602A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 602A to improve its quality when a high-k material is used.

The gate electrode 602B of the access transistor 600 of substrate 601 is formed on the gate dielectric layer 602A and may consist of at least one P-type work function metal or N-type work function metal, depending on whether the transistor is to be a PMOS or an NMOS transistor. In some implementations, the gate electrode 602B may consist of a stack of two or more metal layers, where one or more metal layers are work function metal layers and at least one metal layer is a conductive fill layer.

For a PMOS transistor, metals that may be used for the gate electrode 602B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 602B may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode 602B may consist of one or more U-shaped metal layers formed atop one or more planar, non-U-shaped layers.

In some implementations of the invention, a pair of sidewall spacers 610 are on opposing sides of the gate 602 that bracket the gate stack. The sidewall spacers 610 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As is well known in the art, source region 604 and drain region 606 are formed within the substrate adjacent to the gate stack of each MOS transistor. The source region 604 and drain region 606 are generally formed using either an implantation/diffusion process or an etching/deposition process. In the former process, dopants such as boron, aluminum, antimony, phosphorous, or arsenic may be ion-implanted into the substrate to form the source region 604 and drain region 606. An annealing process that activates the dopants and causes them to diffuse further into the substrate typically follows the ion implantation process. In the latter process, the substrate 601 may first be etched to form recesses at the locations of the source and drain regions. An epitaxial deposition process may then be carried out to fill the recesses with material that is used to fabricate the source region 604 and drain region 606. In some implementations, the source region 604 and drain region 606 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 604 and drain region 606 may be formed using one or more alternate semiconductor materials such as germanium or a group III-V material or alloy. And in further embodiments, one or more layers of metal and/or metal alloys may be used to form the source region 604 and drain region 606. In the illustrative embodiment, an isolation 608 is adjacent to the source region 604, drain region 606 and portions of the substrate 601.

In an embodiment, a source contact 616 and a drain contact 618 are formed in a dielectric layer 611 and in the dielectric layer 612 above the gate electrode 602B. In the illustrated embodiment, a dielectric layer 620 is adjacent to the gate contact 614, drain contact 618, source contact 616 and the SOT memory device 100.

In an embodiment, the source contact 616, the drain contact 618 and gate contact 614 each include a multi-layer stack. In an embodiment, the multi-layer stack includes two or more distinct layers of metal such as a layer of Ti, Ru or Al and a conductive cap on the layer of metal. The conductive cap may include a material such as W or Cu.

The isolation 608 and dielectric layer 620 may include any material that has sufficient dielectric strength to provide electrical isolation such as, but not, limited silicon dioxide, silicon nitride, silicon oxynitride, carbon doped nitride and carbon doped oxide.

Figure 7:
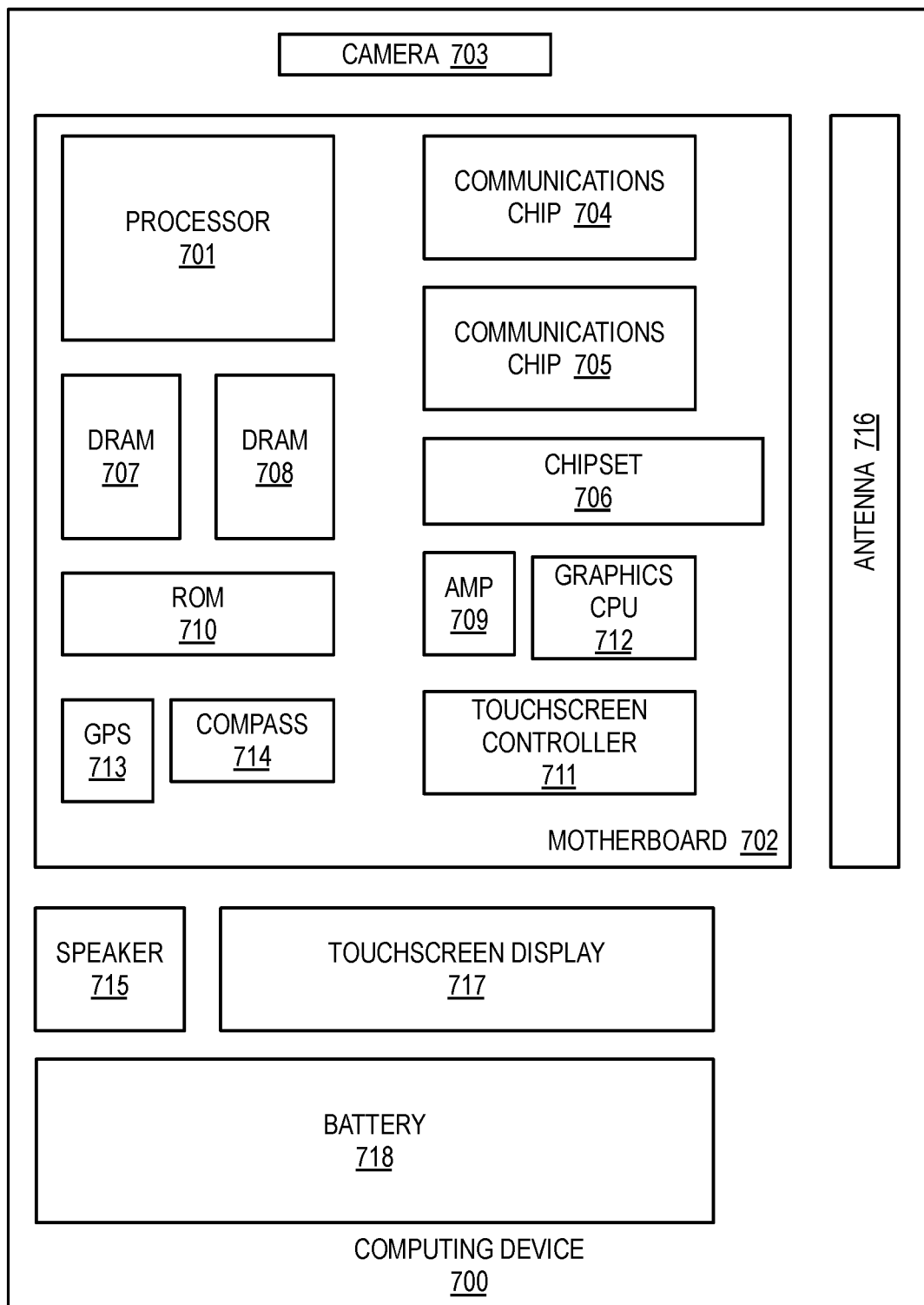
FIG. 7 illustrates a computing device in accordance with embodiments of the present disclosure.

FIG. 7 illustrates a computing device 700 in accordance with embodiments of the present disclosure. As shown, computing device 700 houses a motherboard 702. Motherboard 702 may include a number of components, including but not limited to a processor 701 and at least one communications chip 704 or 705. Processor 701 is physically and electrically coupled to the motherboard 702. In some implementations, communications chip 705 is also physically and electrically coupled to motherboard 702. In further implementations, communications chip 705 is part of processor 701.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset 706, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 705 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 705 may implement any of a number of wireless standards or protocols, including but not limited to Wi-Fi (IEEE 802.6 family), WiMAX (IEEE 802.8 family), IEEE 802.10, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communications chips 704 and 705. For instance, a first communications chip 705 may be dedicated to shorter range wireless communications such as Wi-Fi and Bluetooth and a second communications chip 704 may be dedicated to longer range wireless communications such as GPS, EDGE, GPRS, CDMA, WiMAX, LTE, Ev-DO, and others.

Processor 701 of the computing device 700 includes an integrated circuit die packaged within processor 701. In some embodiments, the integrated circuit die of processor 701 includes one or more memory devices, such as a SOT memory device 100 including a MTJ device 104 in accordance with embodiments of the present disclosure. The term "processor" may refer to any device or portion of a device that processes electronic data from registers and/or memory to transform that electronic data into other electronic data that may be stored in registers and/or memory.

Communications chip 705 also includes an integrated circuit die packaged within communication chip 705. In another embodiment, the integrated circuit die of communications chips 704, 705 include a SOT memory device such as a SOT memory device 100 including a MTJ device 104 on a SOT electrode 102.

Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics CPU 712, flash memory, global positioning system (GPS) device 713, compass 714, a chipset 706, an antenna 716, a power amplifier 709, a touchscreen controller 711, a touchscreen display 717, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 700 and discussed above may contain a stand-alone integrated circuit memory die that includes one or more arrays of memory cells including one or more memory devices, such as a spin orbit torque memory device 100, including a MTJ device 104 on a SOT electrode 102, built in accordance with embodiments of the present disclosure.

In various implementations, the computing device 700 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
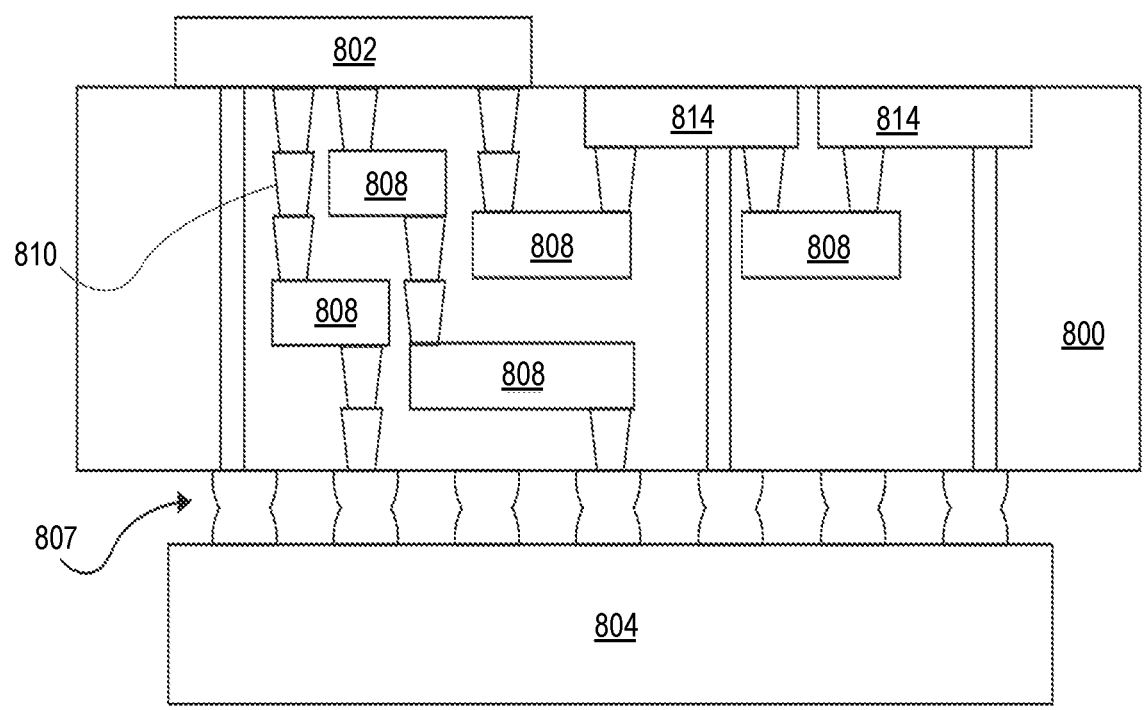
FIG. 8 illustrates an integrated circuit (IC) structure that includes one or more embodiments of the present disclosure.

FIG. 8 illustrates an integrated circuit (IC) structure 800 that includes one or more embodiments of the disclosure. The integrated circuit (IC) structure 800 is an intervening substrate used to bridge a first substrate 802 to a second substrate 804. The first substrate 802 may be, for instance, an integrated circuit die. The second substrate 804 may be, for instance, a memory module, a computer mother, or another integrated circuit die. Generally, the purpose of an integrated circuit (IC) structure 800 is to spread a connection to a wider pitch or to reroute a connection to a different connection. For example, an integrated circuit (IC) structure 800 may couple an integrated circuit die to a ball grid array (BGA) 807 that can subsequently be coupled to the second substrate 804. In some embodiments, the first and second substrates 802/804 are attached to opposing sides of the integrated circuit (IC) structure 800. In other embodiments, the first and second substrates 802/804 are attached to the same side of the integrated circuit (IC) structure 800. And in further embodiments, three or more substrates are interconnected by way of the integrated circuit (IC) structure 800.

The integrated circuit (IC) structure 800 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials. The integrated circuit (IC) structure may include metal interconnects 808 and vias 810, including but not limited to through-silicon vias (TSVs) 810. The integrated circuit (IC) structure 800 may further include embedded devices 814, including both passive and active devices. Such devices include, but are not limited to, capacitors, decoupling capacitors, resistors, inductors, fuses, diodes, transformers, device structure including transistors, such as transistors 500 and 520 coupled with a with one at least one SOT memory device such as the SOT memory device 100 which includes the MTJ device 104 on the SOT electrode 102, where the SOT electrode includes a first SOC layer 106 and a second SOC layer 114 on the first SOC layer 106, and further where at least a portion of the first SOC layer 106 proximal to the second SOC layer 114 includes oxygen, for example. The integrated circuit (IC) structure 800 may further include embedded devices 814 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 800. In accordance with embodiments of the present disclosure, apparatuses or processes disclosed herein may be used in the fabrication of integrated circuit (IC) structure 800.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a spin orbit torque memory device such as the spin orbit torque memory device 100. The spin orbit torque memory devices 100 may be used in an embedded non-volatile memory application Thus, embodiments of the present disclosure include spin orbit torque memory devices and methods to form the same.

Specific embodiments are described herein with respect to spin orbit torque memory devices. It is to be appreciated that embodiments described herein may also be applicable to other non-volatile memory devices. Such non-volatile memory devices may include, but are not limited to, magnetic random-access memory (MRAM) devices, spin torque transfer memory (STTM) devices such as in-plane STTM or perpendicular STTM devices.

In a first example, a spin orbit torque (SOT) device includes a fixed magnet, a first electrode coupled with the fixed magnet, a free magnet, a tunnel barrier between the free magnet and the fixed magnet and a spin orbit torque (SOT) electrode coupled with the free magnet. The SOT electrode includes first layer including a spin orbit coupling material, wherein the first layer has a first lateral length and a second layer including the spin orbit coupling material. The second layer is between the free magnet and the first layer, the second layer is in contact with the first layer over a second lateral length that is smaller than the first lateral length and at least a portion of the first layer at an interface with the second layer includes oxygen.

In second examples, for any of first examples, the portion of the first layer including oxygen is a first portion and has a thickness between 0.1 nm and 0.3 nm.

In third examples, for any of the first through second examples, a second portion of the first layer at an interface with the second layer includes no oxygen.

In fourth examples, for any of the first through third examples, a portion of the first layer at an interface with the second layer includes a greater concentration of oxygen compared to oxygen at an interface between the second layer and the free magnet.

In fifth examples, for any of the first through fourth examples, an uppermost surface of the first layer has a surface roughness that is less than a surface roughness of an uppermost surface of the second layer.

In sixth examples, for any of the first through fifth examples, the first layer includes a first width and the second layer includes the first width.

In seventh examples, for any of the first through sixth examples, the free magnet has a diameter equal to the first width and the second lateral length.

In eighth examples, for any of the first through seventh examples, an uppermost surface of the first layer not covered by the second layer is recessed below a lowermost surface of the second layer, wherein the amount of recess is less than a thickness of the remaining first layer.

In ninth examples, for any of the first through eighth examples, the SOT device further includes a conductive layer adjacent to a sidewall of the first layer and between the sidewall of the first layer and a dielectric layer.

In tenth examples, for any of the ninth examples, the first layer extends over an uppermost surface of the conductive layer.

In eleventh examples, for any of the tenth examples, at least a portion of the uppermost surface of the conductive layer proximal to the second layer includes oxygen.

In twelfth examples, a method of fabricating a spin orbit torque (SOT) device, the method includes depositing and planarizing a layer including a spin orbit coupling material and depositing a second layer including the spin orbit coupling material over the planarized first layer. The method further includes forming a material layer stack for a magnetic tunnel junction (MTJ) memory device, where the forming includes depositing a fixed magnetic layer, depositing a tunnel barrier layer on the fixed magnetic layer and depositing a free magnetic layer on the tunnel barrier layer. The method further includes etching the material layer stack to form a magnetic tunnel junction (MTJ) device and etching the second layer including the spin orbit coupling material by using the MTJ device as a mask. In thirteenth examples, for any of the twelfth through twelfth examples, the method of fabricating a SOT device further includes forming an opening in a dielectric layer, depositing a conductive layer in the opening prior to depositing the first layer including the spin orbit coupling material, depositing the first layer including the spin orbit coupling material on the conductive layer; and planarizing the spin orbit coupling material, portions of the conductive layer and the dielectric layer to form a first spin orbit torque (SOT) electrode in the opening.

In a fourteenth example, for any of the twelfth through thirteenth examples, etching the second layer includes etching the portion of the first layer including oxygen.

In a fifteenth example, for any of the fourteenth examples, the etching further includes recessing an uppermost portion of the first layer by an amount less than a thickness of the second layer.

In sixteenth examples, for any of the twelfth through fifteenth examples, the method of fabricating a SOT device further includes forming a dielectric spacer layer adjacent to the MTJ device.

In seventeenth examples, an apparatus includes a transistor above a substrate. The transistor includes a drain contact coupled to a drain, a source contact coupled to a source, a gate contact coupled to a gate and a spin orbit torque (SOT) device coupled with the drain contact. The SOT device includes a fixed magnet, a first electrode coupled with the fixed magnet, a free magnet, a tunnel barrier between the free magnet and the fixed magnet and a spin orbit torque (SOT) electrode coupled with the free magnet. The SOT electrode includes first layer including a spin orbit coupling material, wherein the first layer has a first lateral length and a second layer including the spin orbit coupling material. The second layer is between the free magnet and the first layer, the second layer is in contact with the first layer over a second lateral length that is smaller than the first lateral length and at least a portion of the first layer at an interface with the second layer includes oxygen.

In eighteenth examples, for any of the seventeenth examples, the portion of the first layer including oxygen is a first portion and has a thickness between 0.1 nm and 0.3 nm.

In nineteenth examples, for any of the seventeenth through eighteenth examples, a second portion of the first layer at an interface with the second layer includes no oxygen.

In a twentieth example, for any of the seventeenth through nineteenth examples, the first layer includes a first width and the second layer includes the first width, and wherein the free magnet has a diameter equal to the first width and the second lateral length.

What is claimed is:

1. A spin orbit torque (SOT) device, comprising:
   a fixed magnet;
   a first electrode coupled with the fixed magnet;
   a free magnet;
   a tunnel barrier between the free magnet and the fixed magnet; and
   a spin orbit torque (SOT) electrode coupled with the free magnet, the SOT electrode comprising:
      a first layer comprising a spin orbit coupling material, wherein the first layer has a first lateral length; and
      a second layer comprising the spin orbit coupling material, wherein:
         the second layer is between the free magnet and the first layer;
         the second layer is in contact with the first layer over a second lateral length that is smaller than the first lateral length; and
         at least a portion of the first layer at an interface with the second layer comprises oxygen.

2. The SOT device of claim 1, wherein the portion of the first layer comprising oxygen is a first portion and has a thickness between 0.1 nm and 0.3 nm.

3. The SOT device of claim 1, wherein a second portion of the first layer at an interface with the second layer comprises no oxygen.

4. The SOT device of claim 1, wherein the portion of the first layer at an interface with the second layer comprises a greater concentration of oxygen compared to oxygen at an interface between the second layer and the free magnet.

5. The SOT device of claim 1, wherein an uppermost surface of the first layer has a surface roughness that is less than a surface roughness of an uppermost surface of the second layer.

6. The SOT device of claim 1, wherein the first layer is a first width and the second layer is the first width.

7. The SOT device of claim 6, wherein the free magnet has a diameter equal to the first width and the second lateral length.

8. The SOT device of claim 1, wherein an uppermost surface of the first layer not covered by the second layer is recessed below a lowermost surface of the second layer, wherein the amount of recess is less than a thickness of the remaining first layer.

9. The SOT device of claim 1, wherein the SOT device further comprises a conductive layer adjacent to a sidewall of the first layer and between the sidewall of the first layer and a dielectric layer.

10. The SOT device of claim 9, wherein the first layer extends over an uppermost surface of the conductive layer.

11. The SOT device of claim 10, wherein at least a portion of the uppermost surface of the conductive layer proximal to the second layer comprises oxygen.

12. A method of fabricating a spin orbit torque (SOT) device, the method comprising:
    depositing and planarizing a first layer including a spin orbit coupling material;
    depositing a second layer including the spin orbit coupling material on the first layer, wherein at least a portion of the first layer at an interface with the second layer comprises oxygen;
    forming a material layer stack for a magnetic tunnel junction (MTJ) memory device, the forming comprising:
       depositing a fixed magnetic layer;
       depositing a tunnel barrier layer over the fixed magnetic layer; and
       depositing a free magnetic layer over the tunnel barrier layer;
    etching the material layer stack, wherein the etching forms a magnetic tunnel junction (MTJ) device; and
    etching the second layer including the spin orbit coupling material to have a second lateral length that is smaller than a first lateral length of the first layer by using the MTJ device as a mask.

13. The method of claim 12, wherein the method further comprises:
    forming an opening in a dielectric layer;
    depositing a conductive layer in the opening prior to depositing the first layer including the spin orbit coupling material;
    depositing the first layer including the spin orbit coupling material on the conductive layer; and
    planarizing the spin orbit coupling material, portions of the conductive layer and the dielectric layer to form a first spin orbit torque (SOT) electrode in the opening.

14. The method of claim 12, wherein etching the second layer comprises etching the portion of the first layer comprising oxygen.

15. The method of claim 14, wherein the etching further comprises recessing an uppermost portion of the first layer by an amount less than a thickness of the second layer.

16. The method of claim 12, further comprises forming a dielectric spacer layer adjacent to the MTJ device.

17. An apparatus comprising:
a transistor above a substrate, the transistor comprising:
   a drain contact coupled to a drain;
   a source contact coupled to a source;
   a gate contact coupled to a gate; and
a spin orbit torque (SOT) device coupled with the drain contact, the SOT device comprising:
   a fixed magnet;
   a first electrode coupled with the fixed magnet;
   a free magnet;
   a tunnel barrier between the free magnet and the fixed magnet; and
   a spin orbit torque (SOT) electrode coupled with the free magnet, the SOT electrode comprising:
      a first layer comprising a spin orbit coupling material, wherein the first layer has a first lateral length; and
      a second layer comprising the spin orbit coupling material,
   wherein:
      the second layer is between the free magnet and the first layer;
      the second layer is in contact with the first layer over a second lateral length that is smaller than the first lateral length; and
      at least a portion of the first layer at an interface with the second layer comprises oxygen; and
a conductive interconnect coupled with the SOT electrode, wherein the MTJ device is between the conductive electrode and the drain contact.

18. The apparatus of claim 17, wherein the portion of the first layer comprising oxygen is a first portion and has a thickness between 0.1 nm and 0.3 nm.

19. The apparatus of claim 17, wherein a second portion of the first layer at an interface with the second layer comprises no oxygen.

20. The apparatus of claim 17, wherein the first layer is a first width and the second layer is the first width, and wherein the free magnet has a diameter equal to the first width and the second lateral length.

* * * * *